(12) United States Patent
Kim et al.

(10) Patent No.: US 11,043,440 B2
(45) Date of Patent: Jun. 22, 2021

(54) SEMICONDUCTOR PACKAGE

(71) Applicant: SAMSUNG ELECTRO-MECHANICS CO., LTD., Suwon-si (KR)

(72) Inventors: Hyung Kyu Kim, Suwon-si (KR); Seong Chan Park, Suwon-si (KR); Sang Hyun Kwon, Suwon-si (KR); Han Kim, Suwon-si (KR); Seung On Kang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/567,560

(22) Filed: Sep. 11, 2019

(65) Prior Publication Data

US 2020/0395263 A1    Dec. 17, 2020

(30) Foreign Application Priority Data

Jun. 14, 2019    (KR) .......................... 10-2019-0070631

(51) Int. Cl.
*H05K 7/20* (2006.01)
*H01L 23/367* (2006.01)
(Continued)

(52) U.S. Cl.
CPC ........ *H01L 23/367* (2013.01); *H01L 23/3178* (2013.01); *H01L 23/3733* (2013.01);
(Continued)

(58) Field of Classification Search
CPC ....... H01L 51/0048–0049; H01L 23/34–4735; H01L 31/024; H01L 31/052–0525;
(Continued)

(56) References Cited

U.S. PATENT DOCUMENTS 6,075,701 A * 6/2000 Ali ..................... H01L 23/3732
174/252
7,118,941 B2 * 10/2006 Zhang .................. H01L 23/373
438/122
(Continued)

FOREIGN PATENT DOCUMENTS

KR    10-2016-0121764 A    10/2016

*Primary Examiner* — Mary A Wilczewski
*Assistant Examiner* — Tsz K Chiu
(74) *Attorney, Agent, or Firm* — Morgan, Lewis & Bockius LLP

(57) ABSTRACT

A semiconductor package includes a semiconductor chip having an active surface, on which a connection pad is disposed, and an inactive surface disposed to oppose the active surface, a heat dissipation member, disposed on the inactive surface of the semiconductor chip, having a plurality of holes and including a graphite-based material, an encapsulant covering at least a portion of each of the semiconductor chip and the heat dissipation member, and a connection member, disposed on the active surface of the semiconductor chip, including a redistribution layer electrically connected to the connection pad. $0<b<0.6a$, in which "a" denotes a planar area of the heat dissipation member and "b" denotes a sum of planar areas of the plurality of holes on a plane.

14 Claims, 19 Drawing Sheets

(51) Int. Cl.
  *H01L 23/00*   (2006.01)
  *H01L 23/31*   (2006.01)
  *H01L 23/495*  (2006.01)
  *H01L 23/373*  (2006.01)
(52) U.S. Cl.
  CPC .. *H01L 23/49527* (2013.01); *H01L 23/49534* (2013.01); *H01L 23/49548* (2013.01); *H01L 24/09* (2013.01); *H01L 24/32* (2013.01); *H01L 2224/02372* (2013.01); *H01L 2224/02377* (2013.01); *H01L 2224/02379* (2013.01)
(58) Field of Classification Search
  CPC ......... H01L 33/64–648; H01L 21/4871–4882; H01L 23/367; C01B 2202/00–36; C01B 32/158–178; Y10S 977/742–752
  See application file for complete search history.

(56) References Cited

U.S. PATENT DOCUMENTS

| | | | |
|---|---|---|---|
| 9,835,390 B2* | 12/2017 | Zhamu | F28F 21/02 |
| 10,087,073 B2* | 10/2018 | Lin | H01L 23/3737 |
| 10,566,482 B2* | 2/2020 | Zhamu | H01L 31/052 |
| 2005/0046017 A1* | 3/2005 | Dangelo | H01L 25/0652 257/720 |
| 2006/0071334 A1* | 4/2006 | Kawabata | H01L 23/4827 257/741 |
| 2009/0237886 A1* | 9/2009 | Iwai | H01L 23/373 361/708 |
| 2010/0124025 A1* | 5/2010 | Yamaguchi | H01L 23/433 361/708 |
| 2012/0236502 A1* | 9/2012 | Yamaguchi | H01L 23/433 361/704 |
| 2012/0262862 A1* | 10/2012 | Johnson | H01L 23/4985 361/679.02 |
| 2013/0307136 A1* | 11/2013 | Yamaguchi | H01L 23/373 257/712 |
| 2014/0140008 A1* | 5/2014 | Yamaguchi | H01L 21/4882 361/705 |
| 2015/0235990 A1* | 8/2015 | Cheng | H01L 24/97 257/712 |
| 2015/0262904 A1* | 9/2015 | Hung | H01L 25/105 257/713 |
| 2015/0380334 A1* | 12/2015 | Hu | H01L 24/97 257/712 |
| 2016/0086872 A1* | 3/2016 | Sakita | H01L 23/373 361/704 |
| 2016/0141222 A1* | 5/2016 | Sato | H01L 23/373 257/717 |
| 2016/0300774 A1 | 10/2016 | Kim et al. | |
| 2017/0162556 A1* | 6/2017 | Lin | H01L 23/24 |
| 2017/0301608 A1* | 10/2017 | Chang | H01L 24/73 |
| 2018/0061736 A1* | 3/2018 | Hirose | H01L 23/3675 |
| 2018/0269127 A1 | 9/2018 | Hung et al. | |
| 2019/0077665 A1* | 3/2019 | Maruyama | C01B 32/168 |

* cited by examiner

SEMICONDUCTOR PACKAGE

CROSS-REFERENCE TO RELATED APPLICATION(S)

This application claims benefit of priority to Korean Patent Application No. 10-2019-0070631 filed on Jun. 14, 2019 in the Korean Intellectual Property Office, the disclosure of which is incorporated herein by reference in its entirety.

TECHNICAL FIELD

The present disclosure relates to a semiconductor package.

BACKGROUND

Semiconductor packages have been continuously required to be light, slim, short, and small in terms of a shape, and have been required to be implemented in a system in package (SiP) form requiring complexation and multifunctionality in terms of function. Recently developed semiconductor packages are required to have a structure and a material which may improve heat dissipation characteristics of rapidly discharging heat, generated during operation, to the outside of the package while significantly decreasing a thickness of the package.

SUMMARY

An aspect of the present disclosure is to provide a semiconductor package to which a heat dissipation member may be introduced to improve heat dissipation characteristics. Another aspect of the present disclosure is to provide a semiconductor package which may address reliability issues such as cohesion of a heat dissipation member, interface delamination between components between a semiconductor chip and a heat dissipating member, internal cracking of the heat dissipating member, and the like.

According to an aspect of the present disclosure, a semiconductor package includes a heat dissipation member, disposed on an inactive surface of a semiconductor chip. The heat dissipation member includes a carbon material, having better thermal conductivity characteristics than those of a semiconductor chip and thermal expansion characteristics similar to those of than the semiconductor chip, and has a plurality of holes formed therein.

For example, a semiconductor package includes a semiconductor chip having an active surface, on which a connection pad is disposed, and an inactive surface disposed to oppose the active surface, a heat dissipation member, disposed on the inactive surface of the semiconductor chip, having a plurality of holes and including a graphite-based material, an encapsulant covering at least a portion of each of the semiconductor chip and the heat dissipation member, and a connection member, disposed on the active surface of the semiconductor chip, including a redistribution layer electrically connected to the connection pad. $0<b<0.6a$, in which "a" denotes a planar area of the heat dissipation member and "b" denotes a sum of planar areas of the plurality of holes on a plane.

Alternatively, a semiconductor package includes a semiconductor chip having an active surface, on which a connection pad is disposed, and an inactive surface disposed to oppose the active surface, a heat dissipation member, disposed on the inactive surface of the semiconductor chip, having a plurality of holes and including a graphite-based material, an adhesive member, disposed between the inactive surface of the semiconductor chip and the heat dissipation member, filling a portion of at least one of the plurality of holes, an encapsulant covering at least a portion of each of the semiconductor chip and the heat dissipation member, and a connection member, disposed on the active surface of the semiconductor chip, including a redistribution layer electrically connected to the connection pad.

Alternatively, a semiconductor package includes a semiconductor chip having an active surface, on which a connection pad is disposed, and an inactive surface disposed to oppose the active surface; a heat dissipation member disposed on the inactive surface of the semiconductor chip, having a plurality of holes, and including a graphite-based material; an encapsulant covering at least a portion of each of the semiconductor chip and the heat dissipation member; and a connection member disposed on the active surface of the semiconductor chip, and including a redistribution layer electrically connected to the connection pad. The plurality of holes are filled with the encapsulant or a metal.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
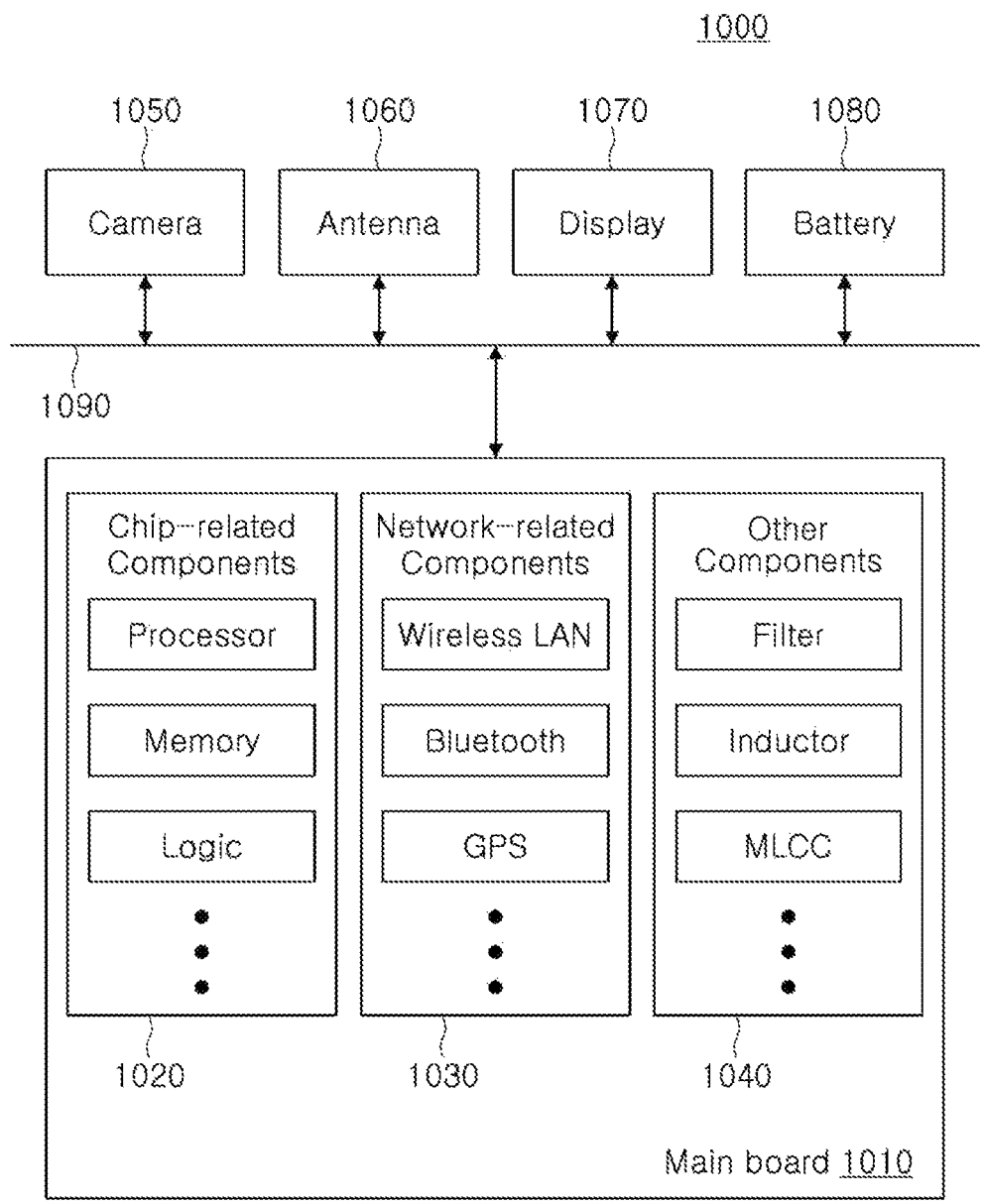
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
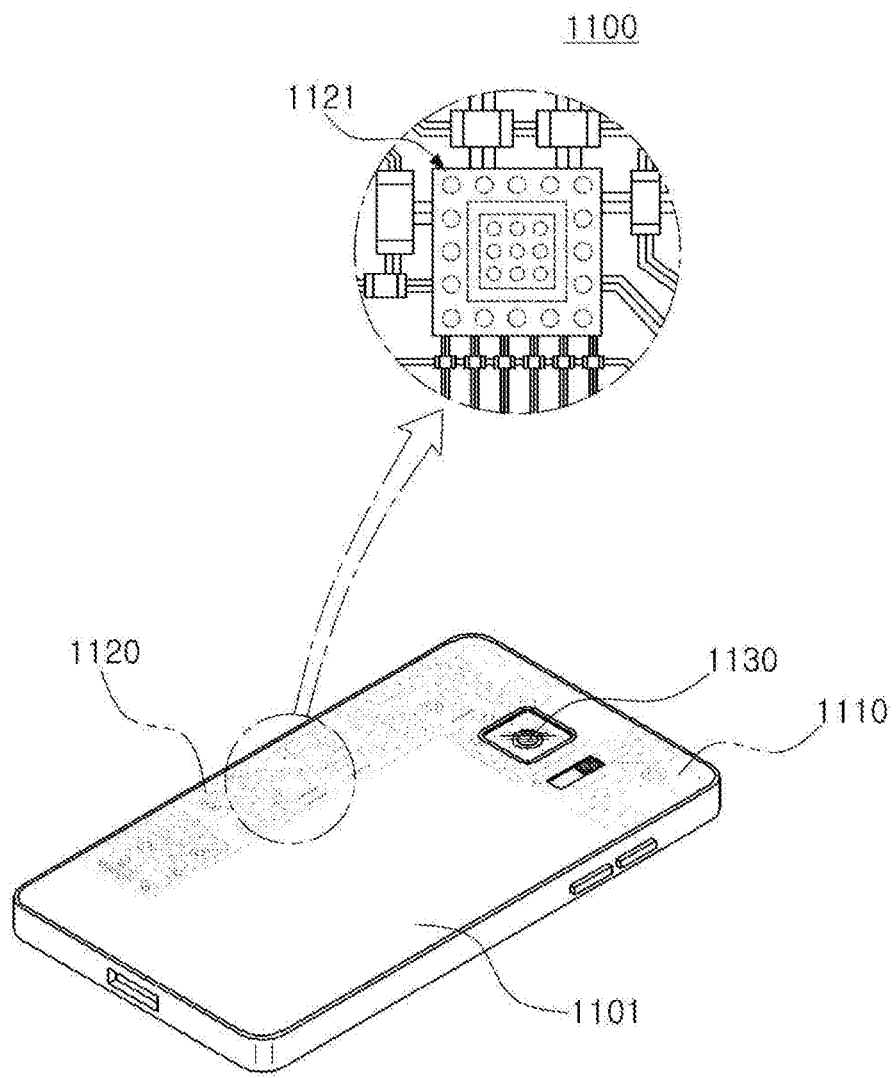
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
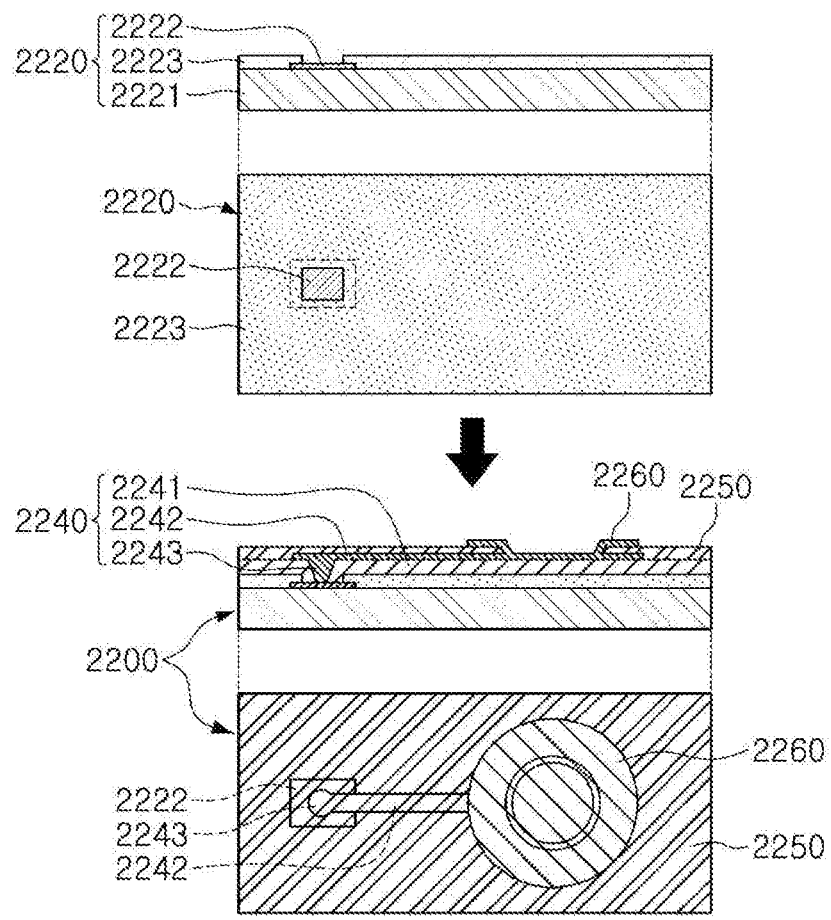
FIGS. 3A and 3B are schematic cross-sectional views illustrating states of a fan-in semiconductor package before and after being packaged.
Figure 3B:
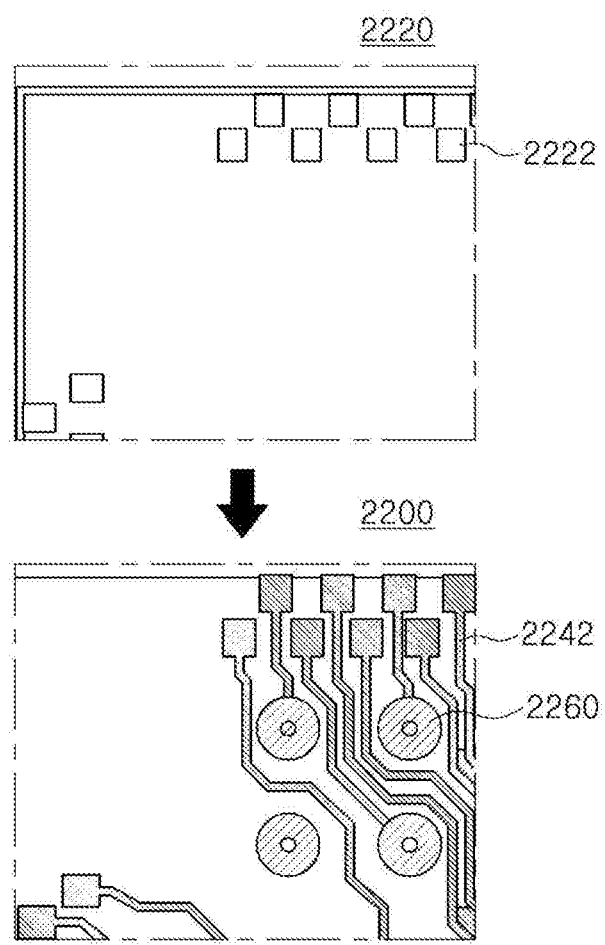

FIGS. 3A and 3B are schematic cross-sectional views illustrating states of a fan-in semiconductor package before and after being packaged.

Figure 4:
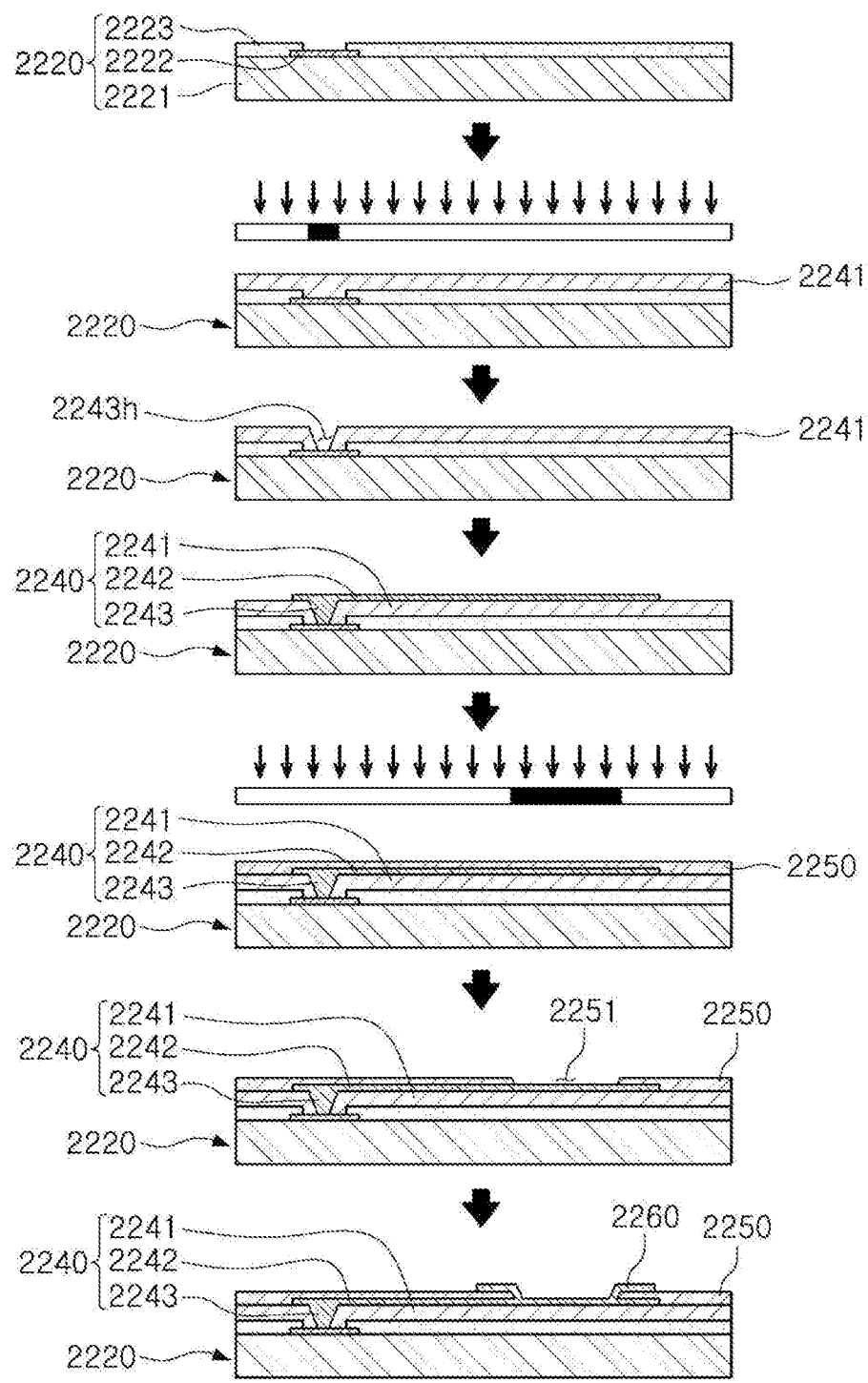
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
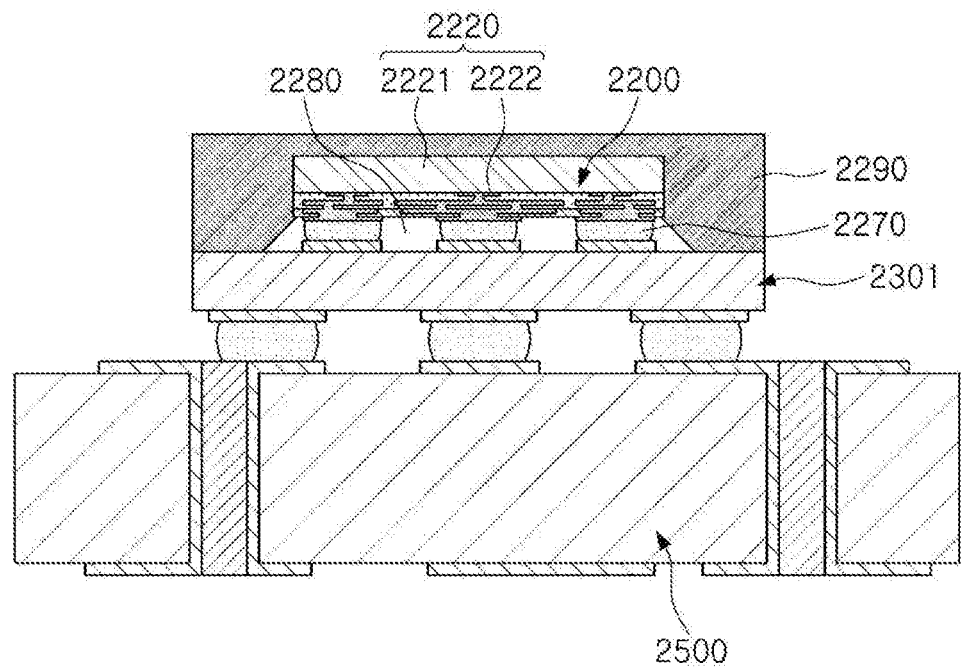
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
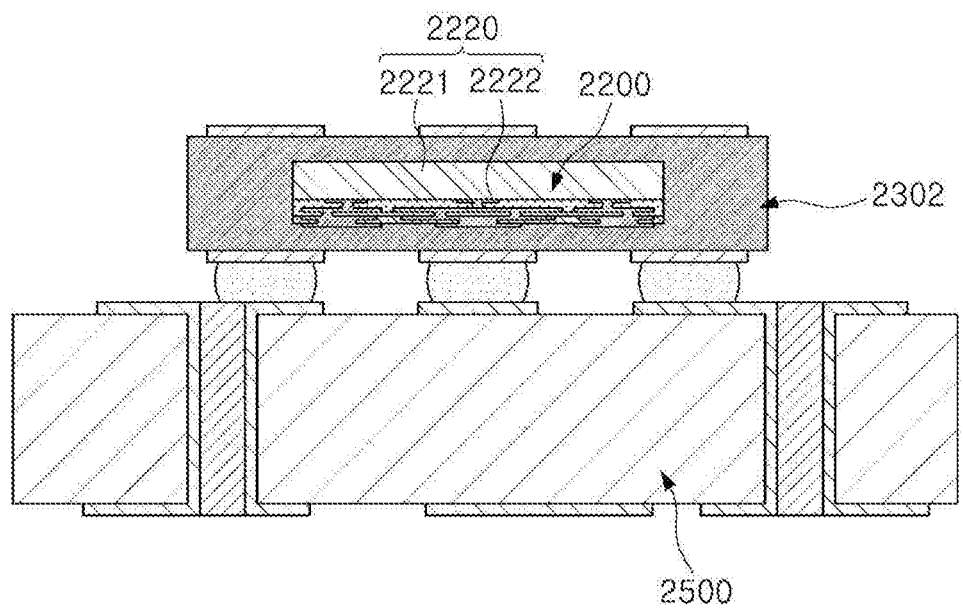
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
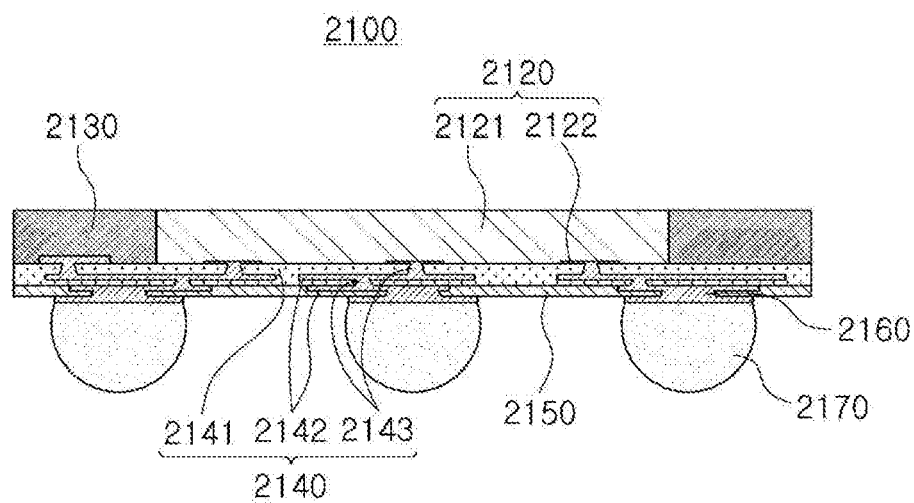
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
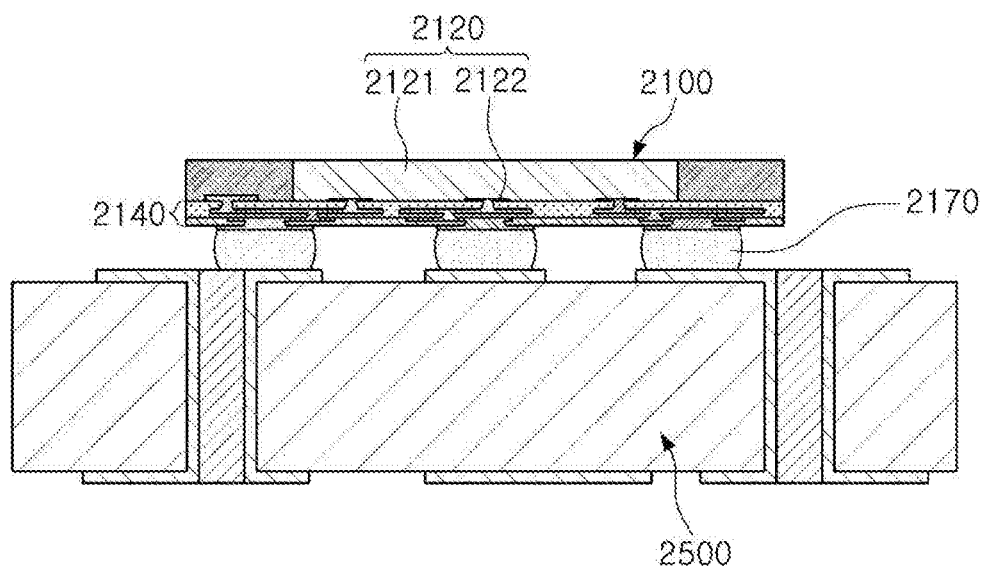
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Figure 9:
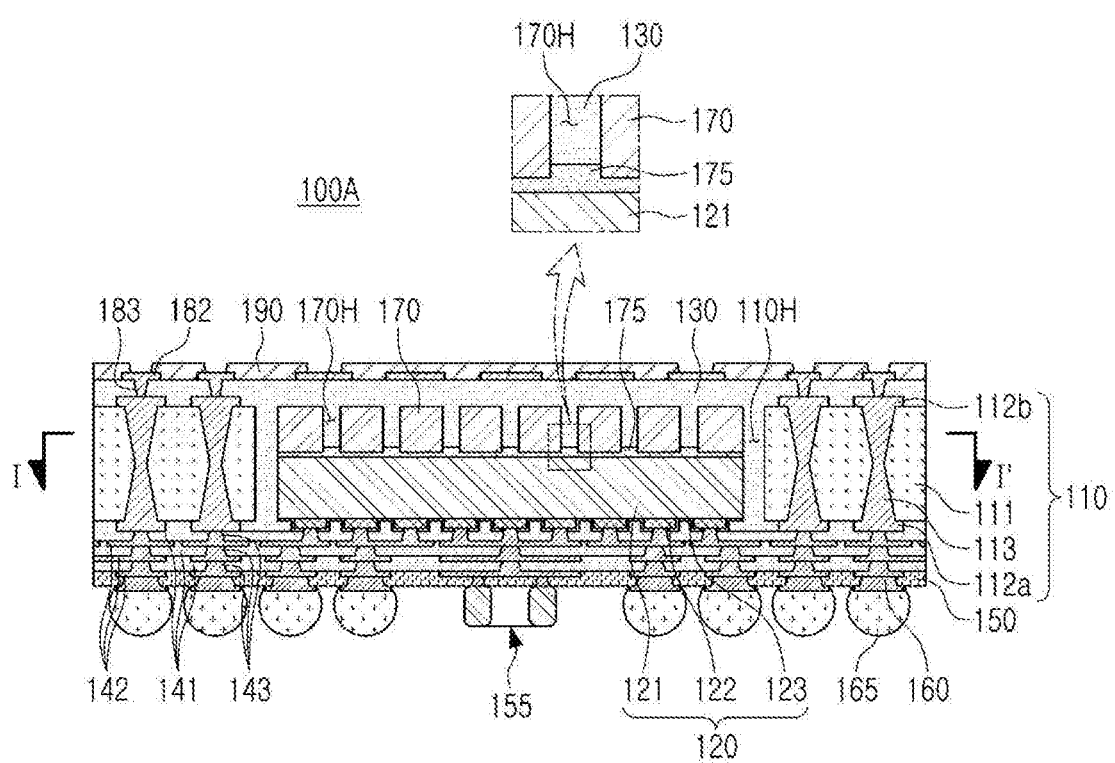
FIG. 9 is a cross-sectional view illustrating an example of a semiconductor package.
Figure 10:
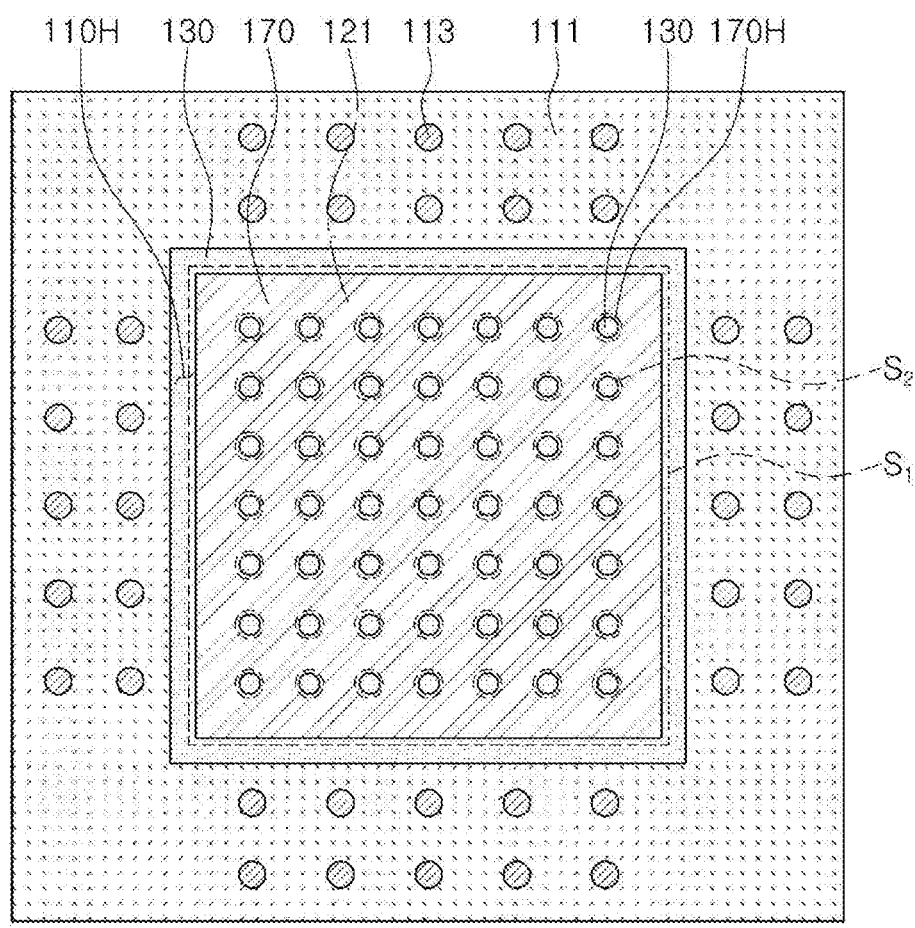
FIG. 10 is a cutaway top view taken along line I-I' of semiconductor package of FIG. 9.

FIG. 9 is a cross-sectional view illustrating an example of a semiconductor package, and FIG. 10 is a cutaway top view taken along line I-I' of semiconductor package of FIG. 9.

Referring to FIGS. 9 and 10, a semiconductor package 100A according to an example embodiment includes a frame 110 having a through-hole 110H and including a plurality of wiring layers 112a and 112b electrically connected to each other, a semiconductor chip 120, disposed in the through-hole 110H of the frame 110, having an active surface on which a connection pad 122 is disposed and an inactive surface disposed to oppose the active surface, a heat dissipation member 170, disposed on the inactive surface of the semiconductor chip 120, having a plurality of holes 170H and including a graphite-based material, an adhesive member 175 disposed between the inactive surface of the semiconductor chip 120 and the heat dissipation member 170, an encapsulant 130 covering at least a portion of each of the frame 110, the semiconductor chip 120, and the heat dissipation member 170, a connection member 140, disposed on a bottom surface of the frame 110 and the active surface of the semiconductor chip 120, including a redistribution layer 142 electrically connected to the connection pad 122, a first passivation layer 150 disposed on a bottom surface of the connection member 140, an underbump metal layer 160 disposed on an opening of the first passivation layer 150, an electric connection metal 165 disposed on a bottom surface of the first passivation layer 150 and connected to the underbump metal layer 160, a backside wiring layer 182 disposed on a top surface of the encapsulant 130, a backside via 183 penetrating through the encapsulant 130 and electrically connecting the backside wiring layer 182 to the plurality of wiring layers 112a and 112b, a second passivation layer 190 disposed on the top surface of the encapsulant 130, and a passive component 155 disposed on a bottom surface of the first passivation layer 150.

In the case of a system on chip (SoC) such as an application processor (AP), heat is locally generated at an internal location of a semiconductor chip in which an operation is performed. Therefore, the closer the heat dissipation member is to a heating location, the more effective heat dissipation may be. To this end, attaching a metal lump, including copper (Cu), to an inactive surface of a semiconductor chip could be considered. However, since a metal such as copper (Cu) has a higher coefficient of thermal expansion than silicon (Si) constituting a body of the semiconductor chip, interface delamination may occur between the semiconductor chip and the metal bump due to mechanical stress caused by temperature variation. In addition, since a metal such as copper (Cu) has higher ductility than silicon (Si) having high brittleness, burring, or the like, may occur when two materials are bonded and then cut.

Meanwhile, in the case of the semiconductor package 100A according to an example embodiment, the heat dissipation member 170, including a graphite-based material having higher thermal conductivity than silicon (Si), may be disposed on the inactive surface of the semiconductor chip 120 to secure heat dissipation characteristics. Since the graphite-based material has a coefficient of thermal expansion similar to that of silicon (Si), issues such as interface delamination between the semiconductor chip 120 and the heat dissipation member 170 or the occurrence of burring may be addressed. The heat dissipation member 170 may include pyrolytic graphite as the graphite-based material. Since the pyrolytic graphite may have a relatively great thickness, workability of the pyrolytic graphite may be further improved. The pyrolytic graphite may include thermal pyrolytic graphite (TPG), highly oriented pyrolytic graphite (HOPG), compression annealed pyrolytic graphite (CAPG), or the like. The pyrolytic graphite may be prepared in the form of a sheet by pyrolyzing a raw material such as polyimide at high temperature to be carbonized and graphitized and may be, for example, a pyrolytic graphite sheet (PGS). The PGS may have a high thermal conductivity in a planar direction (an x-y direction), a direction in which the inactive surface of the semiconductor chip 120 extends. The heat dissipation member 170 may include 90 wt % or more of the above-described pyrolytic graphite. The heat dissipation member 170 may further include less than 5 wt % of a first additive for decreasing thermal contact resistance, for example, at least one of zirconium (Zr), chromium (Cr), and boron (B), a carbide forming additive, and less than 5 wt % of a second additive for increasing thermal conductivity in a vertical direction (a z direction, e.g., a direction perpendicular to the inactive surface of the semiconductor chip 120), for example, carbon nanotubes (CNT), a boron nitride, and a combination thereof (CNT+boron nitride).

The semiconductor package 100A according to an example embodiment may include the heat dissipation member 170 having a plurality of holes 170H to complement cohesion in a vertical direction (a z direction). For example, the pyrolytic graphite may have low cohesion in the vertical direction because atomic layers are bonded by van der Walls interaction but the low cohesion may be improved by processing the plurality of holes 170H. The plurality of holes 170H of the heat dissipation member 170 may be arranged in rows and columns on a plane. Each of the plurality of holes 170H may penetrate through the entire heat dissipation member 170. In an example embodiment, the adhesive member 175, disposed between the inactive surface of the semiconductor chip 120 and the heat dissipation member 170, may fill a portion of a lower side of at least one of the plurality of holes 170H, such that the cohesion may be more effectively improved. The plurality of holes 170H may be filled with the encapsulant 130. For example, the encapsulant 130 may fill a space between wall surfaces of the plurality of holes 170H and may be in contact with at least a portion of a wall surface of each of the plurality of holes 170H. In this case, the above-described cohesion of the heat dissipation member 170 may be further improved. On the plane, $0<b<0.6a$ or $0.05a<b<0.6a$, in which "a" is a planar area $S_1$ of the heat dissipation member 170 and "b" is a sum of planar areas $S_2$ of the plurality of holes 170H. The planar area $S_1$ of the heat dissipation member 170 refers to a result of the rough product of a vertical length and a horizontal length of the heat dissipation member 170 on the plane viewed, for example, in FIG. 10, without respect to processing of the plurality of holes 170H. Outgassing of the adhesive member 175 may be exhausted by processing the plurality of holes 170H to improve reliability of particle contamination, internal fracture, delamination, and the like. However, since an area, occupied by the heat radiation member 170, is decreased as an area, occupied by the plurality of holes 170H, is increased, thermal conductivity of the heat radiation member 170 may be reduced to deteriorate thermal efficiency. On the other hand, an effect of the outgas of the adhesive member 175 on variation of reliability and thermal efficiency may be significantly reduced by processing the plurality of holes 170H.

The heat dissipation member 170 may have a thickness smaller than a thickness of the semiconductor chip 120. For example, the thickness of the heat radiation member 170 may be less than 50% of an entire thickness of the semiconductor chip 120 and the heat radiation member 170. For example, the thickness of the semiconductor chip 120 may range from 50 μm to 180 μm, and the thickness of the heat radiation member 170 may have a range of 20 μm or more, for example, a range of 20 μm to 100 μm. The heat dissipation member 170 includes pyrolytic graphite among carbon-based materials, and thus, may be prepared to have such a thickness range. For example, among other carbon-based materials, graphene has a significantly low thickness and a silicon carbide (SiC) is difficult to be thinned. Meanwhile, pyrolytic graphite is advantageous for relative ease of thickness adjustment and process.

The heat dissipation member 170 may have thermal conductivity higher than thermal conductivity of silicon (Si). For example, the heat dissipation member 170 having a plurality of holes 170H may have thermal conductivity greater than about 150 W/mK, the thermal conductivity of silicon (Si), in the horizontal direction. A difference in coefficients of thermal expansion (CTE) between silicon (Si) having a CTE of about 2.7 ppm/K and the heat dissipation member 170 may not be greater than 10 ppm/K. For example, the heat dissipation member 170 may have a CTE ranging from about 1 ppm/K to 8 ppm/K. The heat dissipation member 170 may significantly reduce the difference in CTE between the heat dissipation member 170 and the semiconductor chip 120 mainly formed of silicon (Si), while having such high thermal conductivity, to effectively prevent warpage and interface delamination from occurring.

The adhesive member 175 may have high interfacial bonding reliability and may also have low thermal resistance. In this regard, the adhesive member 175 may have a thickness of less than 3 μm and thermal conductivity of 0.5 W/mK or less. For example, the adhesive member 175 may be an epoxy-acryl type low-viscosity adhesive having a significantly low thickness of less than or equal to 2 μm. Such an adhesive may be formed by a coating method such as spin coating. Alternatively, the adhesive member 175 may be an epoxy-amine type deposited layer having a significantly low thickness of 850 nm or less, or 500 nm or less. Such a deposited layer may be formed by initiated chemical vapor deposition (iCVD) using an initiator. On the other hand, the adhesive member 175 may have a thickness of 3 μm or more and higher thermal conductivity than 0.5 W/mK. The adhesive member 175 may be a thermally conductive adhesive or tackifier in which a resin is filled with fillers, each having high thermal conductivity. The filler may be a metal filler and/or a ceramic filler, but is not limited thereto.

Hereinafter, the components included in the semiconductor package 100A according to an example embodiment will be described in further detail.

The frame 110 may further improve rigidity of the package 100A according to a detailed material and may serve to secure thickness uniformity of the encapsulant 130, or the like. The semiconductor package 100A may be used as a portion of a package on package (PoP) by the frame 110. The frame 110 has a through-hole 110H. The semiconductor chip 120 and the heat dissipation member 170 are disposed in the through-hole 110H to be spaced apart from the frame 110 by a predetermined distance. A periphery of a side surface of the semiconductor chip 120 may be surrounded by the frame 110. However, such a form is only an example and may be variously modified to have other forms, and the frame 110 may perform another function depending on such a form. As necessary, the frame 110 may be omitted. Instead of the frame 110, a metal post may be introduced for vertical electrical connection. However, when the frame 110 is provided, it may be more advantageous to secure board-level reliability.

The frame 110 has a through-hole 110H penetrating through at least an insulating layer 111. The semiconductor chip 120 is disposed in the through-hole 110H and, as necessary, may be disposed therein together with a passive component. As illustrated in FIG. 10, the through-hole 110H may have a shape in which a wall surface surrounds the semiconductor chip 120, but a shape of the through-hole 110H is not limited thereto. The frame 110 may further include wiring layers 112a and 112b and a wiring via 113, in addition to the insulating layer 111, to serve as an electric connection member.

The insulating layers 111 may be formed of an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. The frame 110 may serve as a support member.

The wiring layers 112a and 112b may provide a vertical electric connection path together with the wiring via 113, and may serve to redistribute the connection pad 122. The wiring layers 112a and 112b may be disposed on a bottom surface and a top surface of the insulating layer 111, respectively. A material of the wiring layer 112a and 112b may be a metal material such as copper (Cu), aluminum (Al), silver (Ag), tin (Sn), gold (Au), nickel (Ni), lead (Pb), titanium (Ti), or alloys thereof. The wiring layers 112a and 112b may perform various functions depending on a design of a corresponding layer. For example, the wiring layers 112a and 112b may include a ground (GrouND: GND) pattern, a power (PoWeR: PWR) pattern, a signal (Signal: S) pattern, and the like. The signal (S) pattern may include various signals other than a ground (GND) pattern, a power (PWR) pattern, and the like, such as a data signal. The wiring layers 112a and 112b may also include a via pad, an electric connection metal pad, and the like. The wiring layers 112a and 112b may be formed by a plating process and may include a seed layer and a conductor layer, respectively.

The wiring via 113 may penetrate through top and bottom surfaces of the insulating layer 111. The wiring via 113 may electrically connect the wiring layers 112a and 112b of the bottom and top surfaces of the insulating layer 111 to each other. As a result, an electrical path may be formed in the frame 110. A material of the wiring via 113 may be a metal material such as copper (Cu), aluminum (Al), silver (Ag), tin (Sn), gold (Au), nickel (Ni), lead (Pb), titanium (Ti), or alloys thereof. The wiring via may be a filled-type via filled with a metal material or a conformal-type via in which a metal material is formed along a wall surface of a via hole. The wiring via 113 may have a cylindrical shape having a substantially constant width. The wiring via 113 may have a via for signal, a via for power, a via for grounding, or the like. The via for power and the via for grounding may be the same via. The wiring via 113 may be formed by a plating process, and may include a seed layer and a conductor layer.

The semiconductor chip 120 may be an integrated circuit (IC) provided in an amount of several hundred to several million or more elements integrated in a single chip. The semiconductor chip 120 may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP), but an example of the semiconductor chip 120 is not limited thereto. The semiconductor chip 120 may be, for example, a logic chip such as an analog-to-digital (ADC) converter, an application-specific integrated circuit (ASIC), or a memory chip such as a volatile memory (for example, a DRAM), a nonvolatile memory (for example, a ROM or a flash memory), or the like. In addition, the chips may be combined with each other.

The semiconductor chip 120 has an active surface, on which the connection pad 122 is disposed, and an inactive surface opposing the active surface. The semiconductor chip 120 may be formed based on an active wafer. In this case, silicon (Si), germanium (Ge), gallium arsenide (GaAs), or the like, may be used as a base material of the body 121. The body 121 may include various circuits formed therein. The connection pad 122 is provided to electrically connect the semiconductor chip 120 to other components. A material of the connection pad 122 may be a metal material such as aluminum (Al), or the like, but is not limited thereto. A passivation layer 123 may be further provided on the body 121 to expose the connection pad 122. The passivation layer 123 may be an oxide layer or a nitride layer, or may be a double layer of an oxide layer and a nitride layer.

Although not shown in the drawings, as necessary, a metal thin film may be provided on a wall surface of the through-hole 110H to achieve heat dissipation and/or electromagnetic interference shielding. As necessary, a plurality of semiconductor chips may be provided in the through-hole 110H to perform the same function or different functions. In this case, one or more, or each, of the plurality of semiconductor chips may be provided with a heat dissipation member 170 and an adhesive member 175. In addition, as necessary, an additional passive component such as an inductor or a capacitor may be provided in the through-hole 110H.

The encapsulant 130 may fill at least a portion of the through-hole 110H and cover at least a portion of each of the frame 110, the semiconductor chip 120, the heat dissipation member 170, and the adhesive member 175. For example, the encapsulant 130 may cover a top surface of the frame 110, four side surfaces of the semiconductor chip 120, a top surface and four side surfaces of the heat dissipation member 170, and four side surfaces of the adhesive member 175. The encapsulant 130 may fill a space between the wall surface of the through-hole 110H and the side surface of the semiconductor chip 120, a space between the wall surface of the through-hole 110H and the side surface of the heat dissipation member 170, a space between the wall surface of the through-hole 110H and the side surface of the heat dissipation member 175, and at least a portion of each of the plurality of holes 170H of the heat radiation member 170. Since the heat dissipation member 170 may also be encapsulated by the encapsulant 130, cohesion of the heat dissipation member 170 may be improved. As described above, since the heat dissipating member 170 may include pyrolytic graphite in which atomic layers are bonded by van der Waals interaction, cohesion may low in a direction perpendicular to the top surface of the semiconductor chip 120. However, the encapsulant 130 is provided to cover the top surface and the side surfaces of the heat dissipation member 170 and to fill the plurality of holes 170H, and thus, the cohesion may be improved.

The encapsulant 130 may fill the through-hole 110H to serve as an adhesive for fixing the semiconductor chip 120 depending on a detailed material and to serve to reduce buckling. The encapsulant 130 may include an insulating material. The insulating material may be a material including an inorganic filler and an insulating resin, such as a thermosetting resin such as an epoxy resin, a thermoplastic resin such as a polyimide resin, or a resin in which a reinforcement such as an inorganic filler is included in the above-described resins, such as an ABF, FR-4, BT, a resin, and the like. Also, the insulating material may be a known molding material such as an epoxy molding compound (EMC) and may be a photosensitive material such as a photoimageable encapsulant (PIE) resin, as necessary. As necessary, the insulating material may be a resin in which an insulating resin such as a thermosetting resin or a thermoplastic resin is impregnated in a core material such as an inorganic filler and/or a glass fiber, and the like.

The connection member 140 may redistribute the connection pad 122 of the semiconductor chip 120. Several tens to several hundreds of connection pads 122 of the semiconductor chip 120, having various functions, may be redistributed through the connection member 140, and may be physically and/or electrically connected to an external component through the electrical connection metal 165 depending on the functions thereof. The connection member 110 includes an insulating layer 141 disposed on a bottom surface of the frame 110 and the active surface of the semiconductor chip 120, a redistribution layer 142 disposed on a top surface of the insulating layer 141, and a connection via 143 penetrating through the insulating layer 141 and electrically connecting the redistribution layer 142 to each of the connection pad 122 and the wiring layers 112a and 112b. Although not illustrated in the drawings, the insulating layer 141, the redistribution layer 142, and the connection via 143 may include a greater number of layers.

A material of the insulating layers 341 may be an insulating material. In this case, a photoimageable dielectric (PID) material may also be used as the insulating material. Since a fine pitch may be introduced through a photovia, it may be advantageous for a fine circuit and a high-density design. Thus, several tens to several millions of connection pads 122 of the semiconductor chip 120 may be effectively redistributed. Boundaries between the insulating layers 141 may be readily apparent or may not be readily apparent.

The redistribution layer 142 may redistribute the connection pads 122 of the semiconductor chip 120 to electrically connect the connection pads 122 of the semiconductor chip 120 to the electrical connector metal 165. A material of the redistribution layer 142 may be a metal material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 182 may include a ground (GND) pattern, a power (PWR) pattern, a signal (S) pattern, and the like. The ground (GND) pattern and the power (PWR) pattern may be the same as each other. The redistribution layer 142 may also include a via pad, an electrical connector metal pad, and the like.

The connection via 143 may electrically connect the redistribution layers 142, formed on different layers, to each other. Also, the connection via 143 may electrically connect the connection pad 122 and the redistribution layer 142 to each other. Also, the connection via 143 may electrically connect the wiring layers 112a and 112b and the redistribution layer 142 to each other. The connection via 143 may be in physical contact with the connection pad 122 when the semiconductor chip 120 is a bare die. A material of the connection via 143 may be a metal material such as copper (Cu), aluminum (Al), silver (Ag), tin (Sn), gold (Au), nickel (Ni), lead (Pb), titanium (Ti), or alloys thereof. The connection via 143 may be a via completely filled with a metal material, or may be a via in which a metal material is formed along a wall surface of a via hole. The connection via 143 may have a tapered shape.

The first passivation layer 150 may protect the connection member 140 from external physical and chemical damages, or the like. The first passivation layer 150 may be omitted. The first passivation layer 150 may include an opening exposing at least a portion of a lowermost redistribution layer 142 of the connection member 140. Several tens to several thousands of the openings may be formed in the first passivation layer 150. Each of the openings may include a plurality of holes. A material of the first passivation layer 150 is not limited. The material of the first passivation layer 150 may be an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, for example, prepreg, ABF, FR-4, BT, or the like. Alternatively, the insulating material may be a solder resist (SR).

The passive component 155 may be disposed on a bottom surface of the first passivation layer 150, and may be disposed between the electrical connection metals 165. The passive component 155 may be omitted. The passive component 155 may be electrically connected to the lowermost redistribution layer 142. The passive component 155 may be, for example, a surface mounting (SMT) component including an inductor, a capacitor, or the like.

The underbump metal layer 160 may improve connection reliability of the electrical connection metal 165. As a result, the underbump metal layer 160 may improve board-level reliability of the package 100A. The underbump metal layer 160 may also be omitted. The underbump metal layer 160 may be connected to the exposed lowermost redistribution layer 142 through the opening of the first passivation layer 150. The underbump metal layer 160 may be formed in the opening of the first passivation layer 150 by a known metallization method using a known material, for example, a metal, but a forming method thereof is not limited thereto.

The electrical connector metal 165 may physically and/or electrically connect the semiconductor package 100A to an external component. For example, the semiconductor package 100A may be mounted on a mainboard of an electronic device through the electrical connector metal 165. The electrical connector metal 165 may be formed of a low melting-point metal such as a solder, but a material of the electrical connector metal 165 is not limited thereto. The electrical connector metal 165 may be a land, a ball, a pin, or the like. The electrical connector metal 165 may have a multilayer structure and a single-layer structure. When the electrical connection metal 165 has a multilayer structure, the electrical connection metal 165 may include a copper pillar and a solder. When the electrical connection metal 165 has a single-layer structure, the electrical connection metal 165 may include a tin-silver solder or copper, but a structure of the electrical connection metal 165 is not limited thereto. The number of the electrical connection metals 165, a gap between the electrical connection metals 165, an arrangement form of the electrical connection metals 165 and the like are not limited to a certain example, and may be sufficiently modified depending on design by those skilled in the art. For example, the number of the electrical connection metals 165 may be several tens to several thousands, or may be greater or smaller than the above example.

At least one of the electrical connection metals 165 may be disposed in a fan-out region. The term "fan-out region" may refer to a region out of a region in which the semiconductor chip 120 is disposed. A fan-out package may have more improved reliability than a fan-in package, and a plurality of input/output (I/O) terminals may be implemented, and a three-dimensional (3D) connection may readily be implemented. Also, a fan-out package may have a smaller thickness and better cost competitiveness than a ball grid array (BGA) package, a land grid array (LGA) package, and the like.

The heat dissipation member 170 may be disposed on the entire inactive surface of the semiconductor chip 120 via the adhesive member 175, and may be disposed in the through-hole 110H of the frame 110 together with the semiconductor chip 120 and the adhesive member 175. The heat dissipation member 170 may have substantially the same size as the inactive surface of the semiconductor chip 120 when viewed from above. For example, at least one side surface of the heat dissipation member 170 may be substantially coplanar with the side surface of the semiconductor chip 120. The heat dissipation member 170 may be provided in the form of a sheet to be bonded to the inactive surface of the semiconductor chip 120 by the adhesive member 175. In another example, the heat dissipation member 170 may be directly bonded to the inactive surface of the semiconductor chip 120. In this case, the surface of the semiconductor chip 120 and the heat dissipation member 170, bonded to each other, may be chemically and mechanically modified by a chemical mechanical polishing (CMP) process, or the like, and may be pressed and/or heated to be bonded.

The heat dissipation member 170 may include a graphite-based material, having thermal conductivity higher than but similar to thermal conductivity of silicon (Si), such as pyrolytic graphite. As described above, the pyrolytic graphite may include thermally pyrolytic graphite (TPG), highly oriented pyrolysis graphite (HOPG), compression annealed pyrolytic graphite (CAPG), and the like. The heat dissipation member 170 may be in the form of a pyrolytic graphite sheet (PGS). The pyrolytic graphite sheet (PSG) may include 90 wt % or more of pyrolytic graphite. The pyrolytic graphite sheet (PSG) may further include less than 5 wt % of at least one of zirconium (Zr), chromium (Cr), and boron (B), as a first additive, and may further include less than 5 wt % of carbon nanotubes (CNT), a boron nitride, and combinations thereof, as a second additive.

The heat dissipation member 170 may have a plurality of holes 170H through which cohesion may be complemented in a vertical direction. The plurality of holes 170H of the heat dissipation member 170 may be arranged in rows and columns when viewed from above. Each of the plurality of holes 170H may penetrate through the entire heat dissipation member 170. In an example embodiment, the adhesive member 175, disposed between the inactive surface of the semiconductor chip 120 and the heat dissipation member 170, may fill a portion of the lower side of at least one of the plurality of holes 170H to more effectively improve the above-mentioned cohesion. The plurality of holes 170H may be filled with the encapsulant 130. For example, the encapsulant 130 may fill a space between the wall surfaces of each of the plurality of holes 170H and may be in contact with at least a portion of the wall surface of each of the plurality of holes 170H. In this case, the above-mentioned cohesion of the heat dissipation member 170 may be further improved. On the plane, $0<b<0.6a$ or $0.05a<b<0.6a$, in which "a" is a planar area $S_1$ of the heat dissipation member 170 and "b" is a sum of planar areas $S_2$ of the plurality of holes 170H. An effect of outgassing of the adhesive member 175 on variation of reliability and thermal efficiency may be significantly reduced through processing of the plurality of holes 170H satisfying the above ranges. The plurality of holes 170H may be processed by irradiation of an ultraviolet laser. In this case, processing precision, processing time, and a state of a processed surface of the hole 170H may be improved.

The heat dissipation member 170 may have a thickness smaller than the thickness of the semiconductor chip 120. For example, a thickness of the heat radiation member 170 may be less than 50% of an entire thickness of the semiconductor chip 120 and the heat radiation member 170. For example, the thickness of the semiconductor chip 120 may range from 50 μm to 180 μm, and the thickness of the heat dissipation member 170 may have a range of 20 μm or more, for example, 20 μm to 100 μm. The heat dissipation member 170 includes pyrolytic graphite, among carbon-based materials, to be manufactured to have such a thickness range. For example, among other carbon-based materials, graphene has a significantly low thickness and a silicon carbide is difficult to be thinned. Meanwhile, pyrolytic graphite is advantageous for relative ease of thickness adjustment and process.

The heat dissipation member 170 may have thermal conductivity higher than thermal conductivity of silicon (Si). For example, the heat dissipation member 170 having a plurality of holes 170H may have thermal conductivity greater than about 150 W/mK, the thermal conductivity of silicon (Si), in the horizontal direction. A difference in coefficients of thermal expansion (CTE) between silicon (Si) having a CTE of about 2.7 ppm/K and the heat dissipation member 170 may not be greater than 10 ppm/K. For example, the heat dissipation member 170 may have a CTE ranging from about 1 ppm/K to 8 ppm/K. The heat dissipation member 170 may significantly reduce the difference in CTE between the heat dissipation member 170 and the semiconductor chip 120 mainly formed of silicon (Si), while having such high thermal conductivity, to effectively prevent warpage and interface delamination from occurring.

The adhesive member 175 may be disposed on the entire inactive surface of the semiconductor chip 120, and may be disposed in the through-hole 110H of the frame 110H together with the semiconductor chip 120 and the heat dissipation member 170. The adhesive member 175 may have substantially the same size as the inactive surface of the semiconductor chip 120 and the heat dissipation member 170, when viewed from above. For example, at least one side surface of the adhesive member 175 may be coplanar with a side surface of the semiconductor chip 120 and a side surface of the heat dissipation member 170. The adhesive member 175 may have a thickness of less than 3 μm and thermal conductivity of 0.5 W/mK or less. For example, the adhesive member 175 may be an epoxy-acryl type low-viscosity adhesive having a significantly low thickness of less than or equal to 2 μm. Such an adhesive may be formed by a coating method such as spin coating. Alternatively, the adhesive member 175 may be an epoxy-amine type deposited layer having a significantly low thickness of 850 nm or less, or 500 nm or less. Such a deposited layer may be formed by initiated chemical vapor deposition (iCVD) using an initiator. On the other hand, the adhesive member 175 may have a thickness of 3 μm or more and higher thermal conductivity than 0.5 W/mK. The adhesive member 175 may be a thermally conductive adhesive or tackifier in which a resin is filled with fillers, each having high thermal conductivity. The filler may be a metal filler and/or a ceramic filler, but is not limited thereto.

The backside wiring layer 182 may be disposed on a top surface of the encapsulant 130, and may be electrically connected to the wiring layers 112a and 112b of the frame 110 by the backside via 183 penetrating through the encapsulant 130. The backside wiring layer 182 and the backside via 183 may be omitted. At least a portion of the backside wiring layer 182 may be upwardly exposed through an opening of the second passivation layer 190. According to example embodiments, the backside via layer 182 may be in the form of a plate above the semiconductor chip 120, and the backside via 183 may be in the form of a trench via or a line vias having a predetermined length. In this case, all propagation paths of electromagnetic waves may be substantially blocked to further improve an electromagnetic interference shielding effect. The backside wiring layer 182 and the backside via 183 may also be formed of copper (Cu), aluminum (Al), silver (Ag), tin (Sn), gold (Au), nickel (Ni), lead (Pb), or alloys thereof.

The second passivation layer 190 may protect the backside wiring layer 182 from external physical and chemical damages, or the like. The second passivation layer 190 may also be omitted. The second passivation layer 190 may have openings exposing at least a portion of the backside wiring layer 182. Tens to several thousands of openings may be formed in the second passivation layer 190. Each of the openings may include a plurality of holes. A material of the second passivation layer 190 is not limited and may be, for example, an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, for example, prepreg, ABF, FR-4, BT, or the like. Alternatively, the insulating material may be a solder resist (SR). Since the first passivation layer 150 and the second passivation layer 190 have the same material, they may serve to control a coefficient of thermal expansion (CTE) due to a symmetrical effect.

Figure 11:
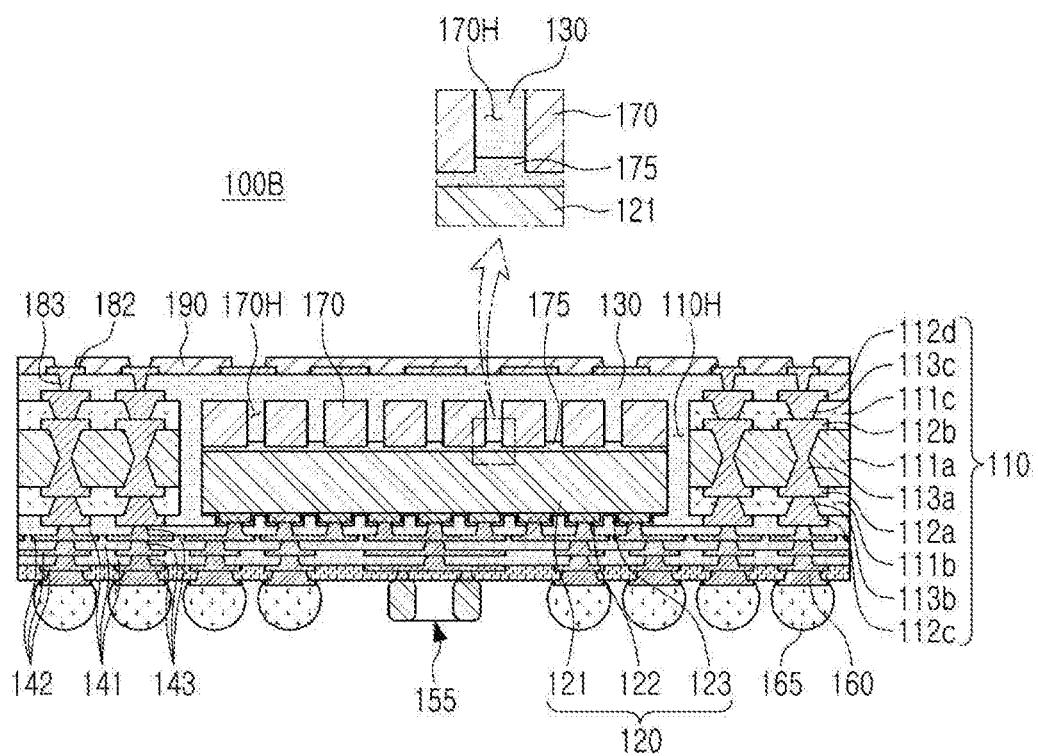
FIG. 11 is a schematic cross-sectional view illustrating another example of a semiconductor package.

FIG. 11 is a schematic cross-sectional view illustrating another example of a semiconductor package.

Referring to FIG. 11, a semiconductor package 100B according to another example embodiment may include a frame 110 different from the frame 110 of the above-described semiconductor package 100A. Specifically, the frame 110 may include a first insulating layer 111a, a first wiring layer 112a and a second wiring layer 112b respectively disposed on both surfaces of the first insulating layer 111a, a second insulating layer 111b and a third insulating layer 111c, respectively disposed on both surfaces of the first insulating layer 111a, respectively covering the first wiring layer 112a and the second wiring layer 112b, a third wiring layer 112c disposed on a side opposing a side of the second insulating layer 111b in which the first wiring layer 112a is embedded, a fourth wiring layer 112d disposed on a side opposing a side of the third insulating layer 111c in which the second wiring layer 112b is embedded, a first wiring via 113a penetrating through the first insulating layer 111a and electrically connecting the first and second wiring layers 112a and 112b to each other, a second wiring via 113b penetrating through the second insulating layer 111b and electrically connecting the first and third wiring layers 112a and 113c to each other, and a third wiring via 113c penetrating through the third insulating layer 111c and electrically connecting the second and fourth wiring layers 112b and 112d. Since the frame 110 has a greater number of wiring layers 112a, 112b, 112c, and 112d, the connection member 140 may be further simplified. The first to fourth wiring layers 112a, 112b, 112c, and 112d may be electrically connected to the connection pad 120P depending on functions thereof.

The first insulating layer 111a may have a thickness greater than a thickness of each of the second and third insulating layers 111b and 111c. The first insulating layer 111a may have a relatively great thickness to maintain rigidity, and the second insulating layer 111b and the third insulating layer 111c may be introduced to form a greater number of wiring layers 112c and 112d. From a similar point of view, the first wiring vias 113a, penetrating through the first insulating layer 111a, may have a height and an average diameter greater than those of each of the second and third wiring vias 113b and 113c penetrating through second and third build-up layers 111b and 111c. In addition, each of the first wiring vias 113a may have an hourglass or cylindrical shape, while each of the second and third wiring vias 113b and 113c may have tapered shapes opposite to each other. Each of the first to fourth wiring layers 112a, 112b, 112c, and 112d may have a thickness greater than a thickness of the redistribution layer 142.

Other configurations are substantially the same as those of the above-described semiconductor package 100A, and thus, a detailed description thereof will be omitted.

Figure 12:
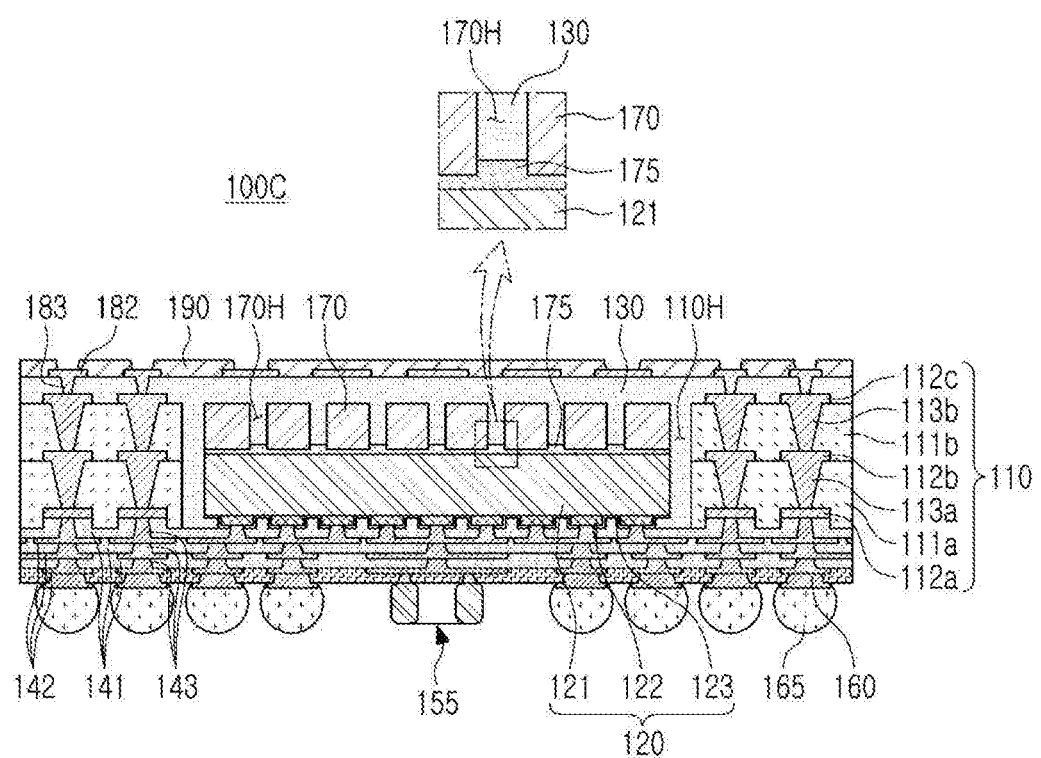
FIG. 12 is a schematic cross-sectional view illustrating another example of a semiconductor package.

FIG. 12 is a schematic cross-sectional view illustrating another example of a semiconductor package.

Referring to FIG. 12, a semiconductor package 100C according to another example embodiment may include a frame 110 different from the frame 110 of the above-described semiconductor package 100A. Specifically, the frame 110 may include a first insulating layer 111a, a second wiring layer 112a embedded in a lower side of the first insulating layer 111a, a second wiring layer 112b disposed on a top surface of the first insulating layer 111a, a second insulating layer 111b, disposed on the top surface of the first insulating layer 111a, embedding the second wiring layer 112b, a third wiring layer 112c disposed on a top surface of the second insulating layer 111b, a first wiring via 113a penetrating through the first insulating layer 111a and electrically connecting the first and second wiring layers 112a and 112b to each other, and a second wiring via 113b penetrating through the second insulating layer 111b and electrically connecting the second and third wiring layers 112b and 112c to each other. Similarly to the above description, since the frame 110 includes the first to third wiring layers 112a, 112b, and 112c, a design of a connection member 140 may be simplified. The first to third wiring layers 112a, 112b, and 112c may be electrically connected to a connection pad 120P depending on functions thereof.

The first wiring layer 112a may be recessed into the first insulating layer 111a. For example, a bottom surface of the first insulating layer 111a may have a step with a bottom surface of the first wiring layer 112a. The recessed region may have substantially the same width as the recessed region. Each of upper and lower sides of the recessed region may have substantially the same width as a bottom surface of the exposed first wiring layer 112a. Each of the first to third wiring layers 112a, 112b, and 112c may have a thickness greater than a thickness of the redistribution layer 142. Since a portion of pads of the first wiring layer 112a may serve as a stopper when forming a hole for the first wiring via 113a, it may be advantageous in process that a wiring via of the first wiring via 113a has a tapered shape in which an upper surface has a width greater than a width of a lower surface. In this case, the wiring via of the first wiring vias 113a may be integrated with a pad pattern of the second wiring layer 112b. Similarly, since a portion of pads of the second wiring layer 112b may serve as a stopper when forming a hole for the second wiring vias 113b, it may be advantageous in process that the wiring via of the second wiring via 113b has a tapered shape in which an upper surface has a width greater than a width of a lower surface. In this case, the wiring via of the second wiring via 113b may be integrated with a pad pattern of the third wiring layer 112c.

Other configurations are substantially the same as those of the above-described semiconductor package 100A, and thus, a detailed description thereof will be omitted.

Figure 13:
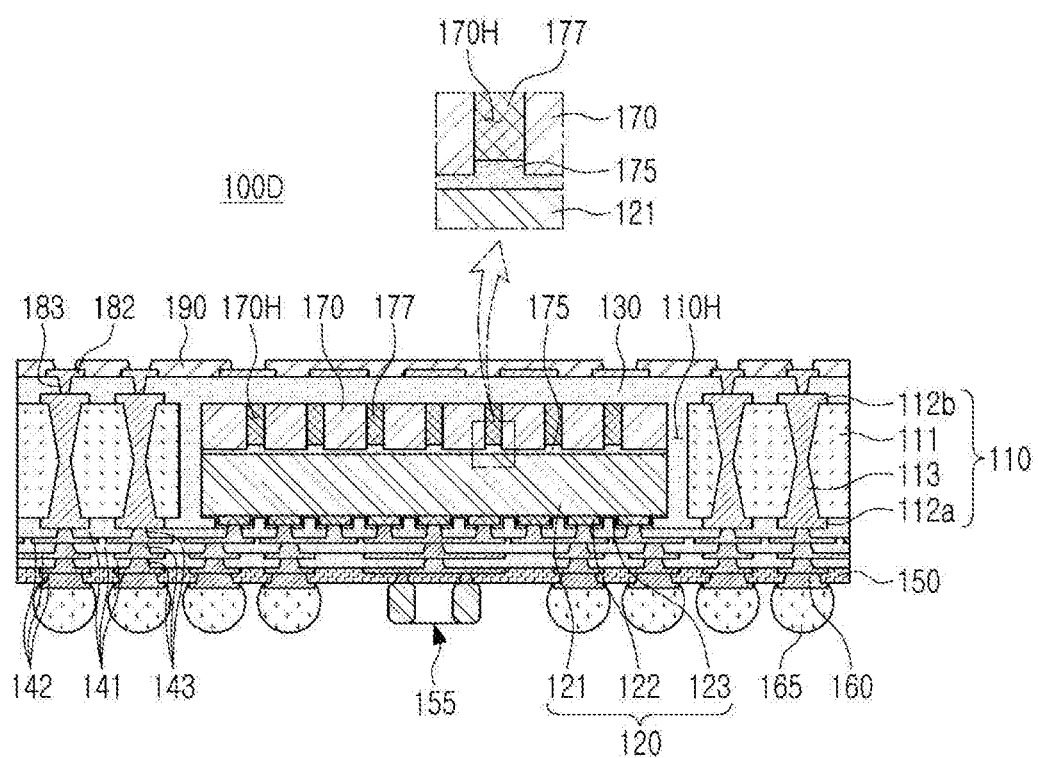
FIG. 13 is a schematic cross-sectional view illustrating another example of a semiconductor package.

FIG. 13 is a schematic cross-sectional view illustrating another example of a semiconductor package.

Referring to FIG. 13, a semiconductor package 100D may further include a first metal layer 177 filling a plurality of holes 170H of a heat dissipation member 170, as compared with the above-described semiconductor package 100A. A first metal layer 177 may perform a heat dissipation function together with the heat dissipation member 170. The first metal layer 177 may be in contact with at least a portion of a wall surface of each of the plurality of holes 170H while filling a space between wall surfaces of each of the plurality of holes 170H. An encapsulant 130 may cover at least a portion of a top surface of the heat dissipation member 170, at least a portion of a side surface of the heat dissipation member 170, and at least a portion of a top surface of the first metal layer 177. The first metal layer 177 may include a metal material such as copper (Cu), aluminum (Al), silver (Ag), tin (Sn), gold (Au), nickel (Ni), lead (Pb), titanium (Ti), or alloys thereof. The first metal layer 177 may fill the hole 170H through pulse-reverse electroplating. Due to the first metal layer 177, the heat dissipation member 170 may improve thermal conductivity in a direction perpendicular to a top surface of the semiconductor chip 120.

Figure 14:
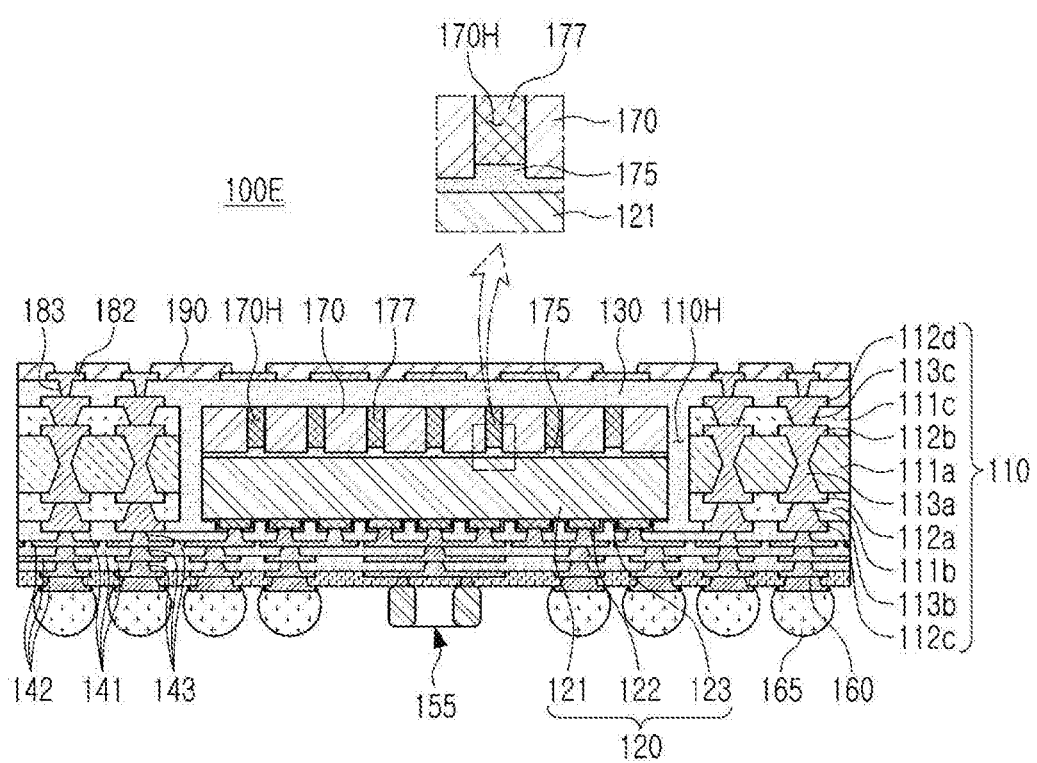
FIG. 14 is a schematic cross-sectional view illustrating another example of a semiconductor package.

FIG. 14 is a schematic cross-sectional view illustrating another example of a semiconductor package.

Referring to FIG. 14, a semiconductor package 100E according to another example embodiment may include a frame 110 different from the frame 110 of the above-described semiconductor package 100D. Specifically, the frame 110 may include a first insulating layer 111a, a first wiring layer 112a and a second wiring layer 112b respectively disposed on both surface of the first insulating layer 111a, a second insulating layer 111b, respectively disposed on both surfaces of the first insulating layer 111a, respectively covering the first and second wiring layers 112a and 112b, a third wiring layer 112c disposed on a side opposing a side of the second insulating layer 111b in which the first wiring layer 112a is embedded, a fourth wiring layer 112d disposed on a side opposing a side of the third insulating layer 111c in which the second wiring layer 112b is embedded, a first wiring via 113a penetrating through the first insulating layer 111a and electrically connecting the first and second wiring layers 112a and 112b to each other, a second wiring via 113b penetrating through the second insulating layer 111b and electrically connecting the first and third wiring layers 112a and 112c, and a third wiring via 113c penetrating through the third insulating layer 111c and electrically connecting the second and fourth wiring layers 112b and 112d. Since the frame 110 includes a greater number of first to third wiring layers 112a, 112b, 112c, and 112d, a connection member 140 may be further simplified. The first to forth wiring layers 112a, 112b, 112c, and 112d may be electrically connected to a connection pad 120P depending on functions thereof.

Other configurations are substantially the same as those of the above-described semiconductor packages 100A, 100B, and 100D, and thus, a detailed description thereof will be omitted.

Figure 15:
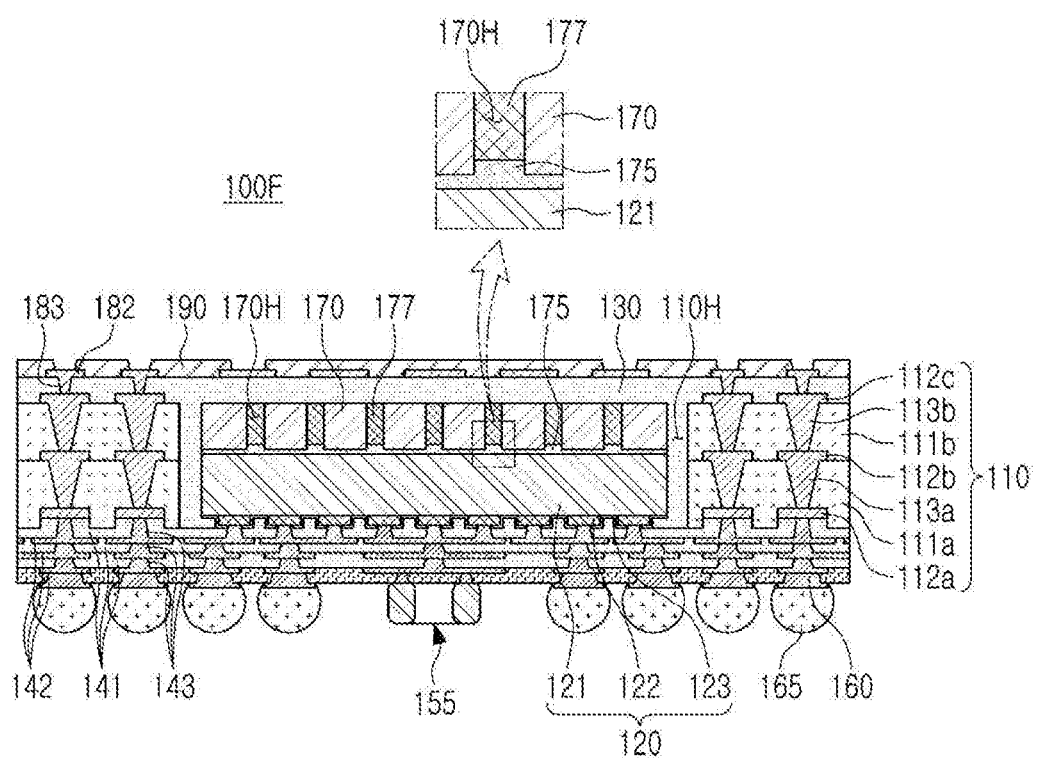
FIG. 15 is a schematic cross-sectional view illustrating another example of a semiconductor package.

FIG. 15 is a schematic cross-sectional view illustrating another example of a semiconductor package.

Referring to FIG. 15, a semiconductor package 100F according to another example embodiment may include a frame 110 different from the frame 110 of the above-described semiconductor package 100D. Specifically, the frame 110 includes a first insulating layer 111a, a first wiring layer 112a buried in a lower side of the first insulating layer 111a, a second wiring layer 112b disposed on a top surface of the first insulating layer 111a, a second insulating layer 111b, disposed on a top surface of the first insulating layer 111a, embedding the second wiring layer 112b, a third wiring layer 112c disposed on a top surface of the second insulating layer 111b, a first wiring via 113a penetrating through the first insulating layer 111a and electrically connecting the first and second wiring layers 112a and 112b to each other, and a second wiring via 113b penetrating through the second insulating layer 111b and electrically connecting the second and third wiring layers 112b and 112c to each other. Similarly to the above description, since the frame 110 includes the first to third wiring layers 112a, 112b, and 112c, a design of a connection member 140 may be simplified. The first to third wiring layers 112a, 112b, and 112c may be electrically connected to a connection pad 120P depending on functions thereof.

Other configurations are substantially the same as those of the above-described semiconductor packages 100A, 100C, and 100D, and thus, a detailed description thereof will be omitted.

Figure 16:
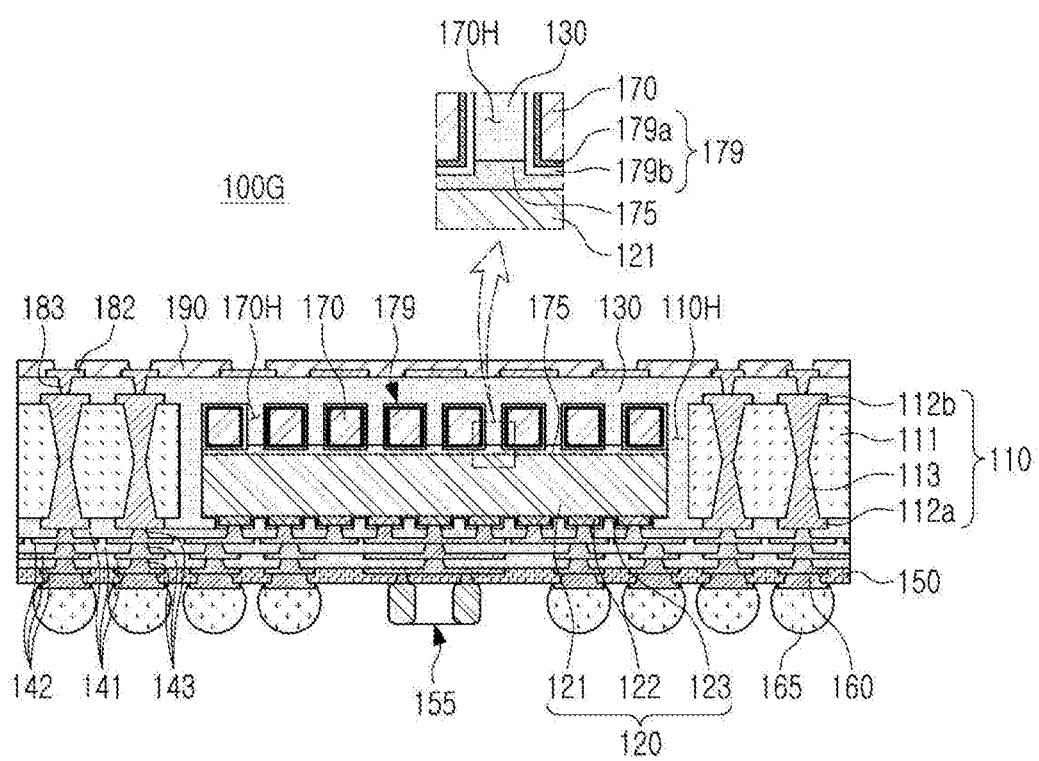
FIG. 16 is a schematic cross-sectional view illustrating another example of a semiconductor package.

FIG. 16 is a schematic cross-sectional view illustrating another example of a semiconductor package.

Referring to FIG. 16, a semiconductor package 100G according to an example embodiment may further include a second metal layer 179 surrounding a heat dissipation member 170, as compare with the above-described semiconductor package 100A. The second metal layer 179 may surround all surfaces of the heat dissipation member 170 and may also be disposed on an internal side surface of a hole 170H. For example, the second metal layer 179 may cover a top surface of the heat dissipation member 170, a bottom surface of the heat dissipation member 170, a side surface of the heat dissipation member 170, and a wall surface of each of a plurality of holes 170H. A second metal layer 179 may be interposed between the heat dissipation member 170 and an encapsulant 130. For example, the encapsulant 130 may fill a space between second metal layers 179 in each of the plurality of holes 170H. The second metal layer 179 may perform a heat dissipation function together with the heat dissipation member 170. The second metal layer 179 may include one or more metal layers. For example, the second metal layer 179 may include a 2-1-th metal layer 179a disposed on the top surface, the bottom surface, and the side surface of the heat dissipation member 170 and the wall surface of each of the plurality of holes 170H, and a 2-2-th metal layer 179b disposed on the 2-1-th metal layer 179a. The 2-1-th metal layer 179a may be in contact with the heat dissipation member 170, and the 2-2-th metal layer 179b may be in contact with an encapsulant 130 and an adhesive member 175. The 2-1-th metal layer 179a may have relatively better bonding force and adhesion force to the heat dissipation member 170 than the 2-2-th metal layer 179b. The 2-1-th metal layer 179a may have a thickness smaller than a thickness of the 2-2-th metal layer 179b. The second metal layer 179 may include a metal material such as copper (Cu), aluminum (Al), silver (Ag), tin (Sn), gold (Au), nickel (Ni), lead (Pb), titanium (Ti), or alloys thereof. For example, the 2-1-th metal layer 179a may be a titanium (Ti) layer, and the 2-2-th metal layer 179b may be a copper (Cu) layer. The second metal layer 179 may be formed using a deposition process such as sputtering before or after the heat dissipation layer 170 is provided on a semiconductor chip 120. Due to the second metal layer 179, the heat dissipation member 170 may be easily treated during a manufacturing process and contamination, caused by particles generated by graphite in the heat dissipation member 170, may be prevented from occurring. In addition, due to the second metal layer 179, the heat dissipation member 170 may have further improved cohesion and thermal conductivity in a direction perpendicular to the top surface of the semiconductor chip 120.

As necessary, the semiconductor package 100G may be further provided with a heat dissipation via penetrating through the encapsulant 130 and electrically connecting the backside wiring layer 182 and the second metal layer 179 to each other. Heat of the semiconductor chip 120 may be emitted upwardly more effectively by the heat dissipation via. An electrical signal may be applied or not applied to the heat dissipation via. When the electrical signal is not applied to the heat dissipation via, the backside wiring layer 182, connected to the heat dissipation via, may serve as a heat dissipation pattern layer. When an electrical signal is applied to the heat dissipation via, the applied signal may be, for example, a ground signal and the heat dissipation member 170 may be electrically connected to a backside wiring layer 182 by the heat dissipation via. A material of the heat dissipation via may be the same as a material of a backside via 183 and may be different from a material of the heat dissipation member 170. The material of the heat dissipation via may be a metal material such as copper (Cu), aluminum (Al), silver (Ag), tin (Sn), gold (Au), nickel (Ni), lead (Pb), titanium (Ti), or alloys thereof.

Other configurations are substantially the same as those of the above-described semiconductor package 100A and thus, a detailed description thereof will be omitted.

Figure 17:
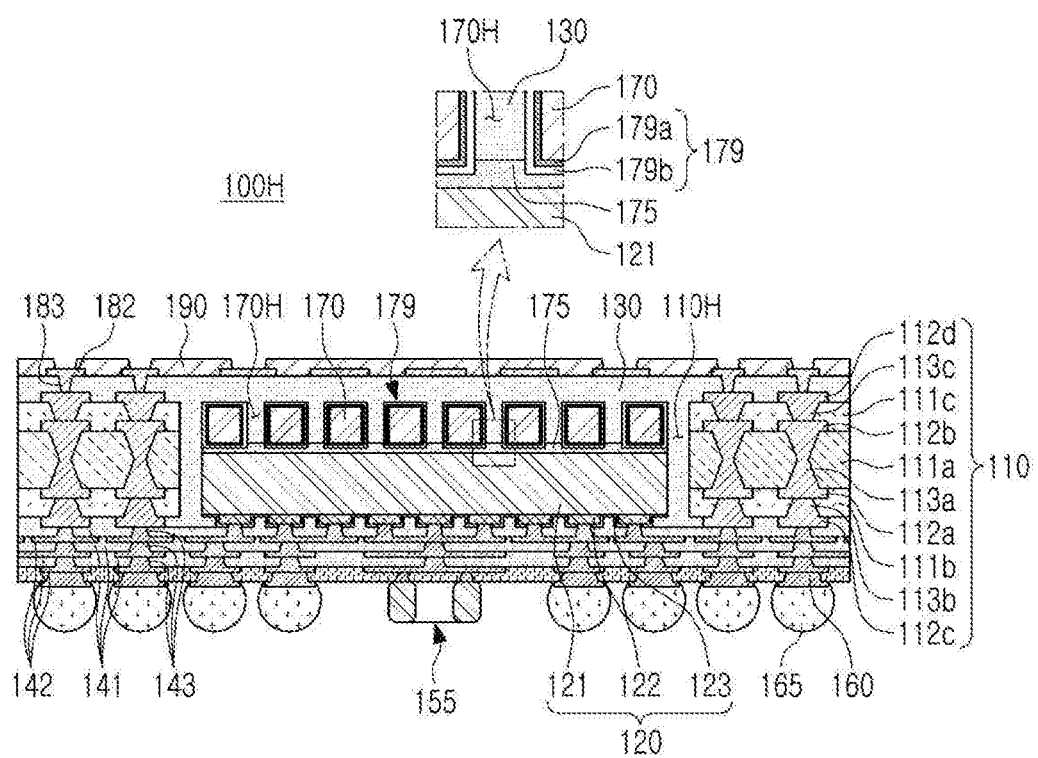
FIG. 17 is a schematic cross-sectional view illustrating another example of a semiconductor package.

FIG. 17 is a schematic cross-sectional view illustrating another example of a semiconductor package.

Referring to FIG. 17, a semiconductor package 100H according to another example embodiment may include a frame 110 different from the frame 110 of the above-described semiconductor package 100G. Specifically, the frame 110 includes a first insulating layer 111a, a first wiring layer 112a and a second wiring layer 112b respectively disposed on both surfaces of the first insulating layer 111a, a second insulating layer 111b and a third insulating layer 111c, respectively disposed on both surfaces of the first insulating layer 111a, respectively covering the first and second wiring layers 112a and 112b, a third wiring layer 112c disposed on a side opposing a side of the second insulating layer 111b in which the first wiring layer 112a is embedded, a fourth wiring layer 112d disposed on a side opposing a side of the third insulating layer 111c in which the second wiring layer 112b is embedded, a wiring via 113a penetrating through the first insulating layer 111a and electrically connecting the first and second wiring layers 112a and 112b to each other, a second wiring via 113b penetrating through the second insulating layer 111b and electrically connecting the first and third wiring layers 112a and 112c to each other, and a third wiring via 113c penetrating through the third insulating layer 111c and electrically connecting the second and fourth wiring layers 112b and 112d to each other. Since the frame 110 includes a greater number of wiring layers 112a, 112b, 112c, and 112d, a design of a connection member 140 may be simplified. The first to fourth wiring layers 112a, 112b, 112c, and 112d may be electrically connected to a connection pad 120P depending on functions thereof.

Other configurations are substantially the same as those of the above-described semiconductor packages 100A, 100B, and 100G, and thus, a detailed description thereof will be omitted.

Figure 18:
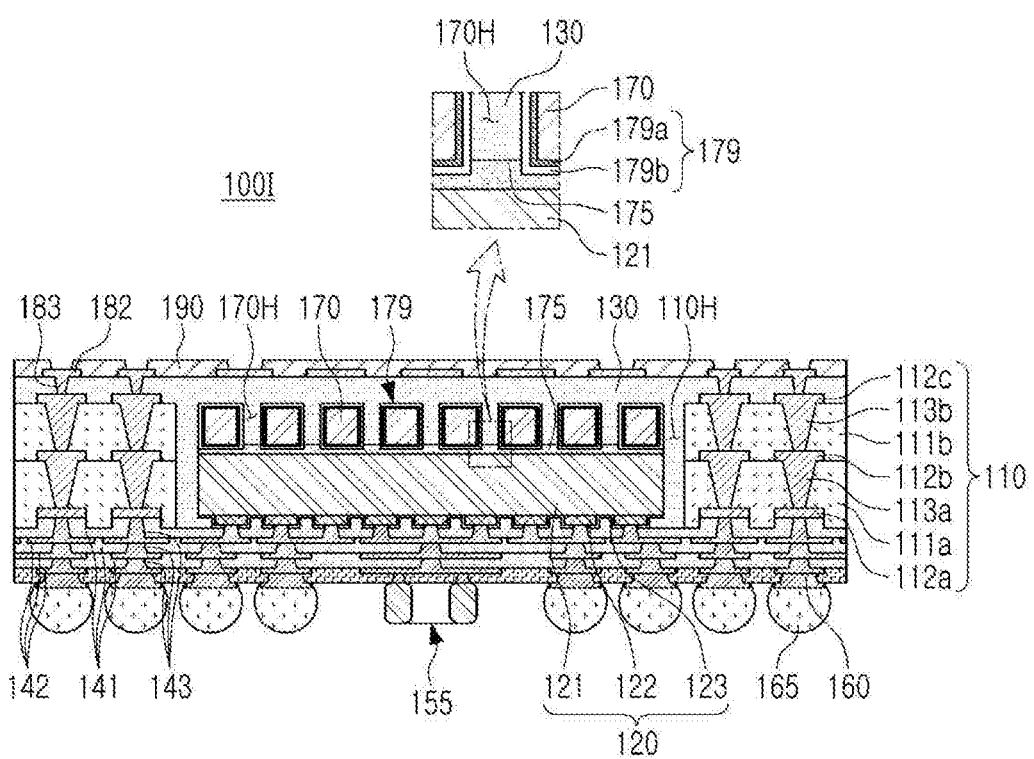
FIG. 18 is a schematic cross-sectional view illustrating another example of a semiconductor package.

FIG. 18 is a schematic cross-sectional view illustrating another example of a semiconductor package.

Referring to FIG. 18, a semiconductor package 100I according to another example embodiment may include a frame 110 different from the frame 110 of the above-described semiconductor package 100G. Specifically, the frame 110 includes a first insulating layer 111a, a first wiring layer 112a embedded in a lower side of the first insulating layer 111a, a second wiring layer 112b disposed on a top surface of the first insulating layer 111a, a second insulating layer 111b disposed on the top surface of the first insulating layer 111a, a third wiring layer 112c disposed on a top surface of the second insulating layer 111b, a first wiring via 113a penetrating through the first insulating layer 111a and electrically connecting first and second wiring layers 112a and 112b to each other, and a second wiring via 113b penetrating through the second insulating layer 111b and electrically connecting the second and third wiring layers 112b and 112c. Similarly to the above description, since the frame 110 includes the first to fourth wiring layers 112a, 112b, 112c, and 112d, a design of a connection member 140 may be simplified. The first to fourth wiring layers 112a, 112b, 112c, and 112d may be electrically connected to a connection pad 120P depending on functions thereof.

Other configurations are substantially the same as those of the above-described semiconductor packages 100A, 100C, and 100G, and thus, a detailed description thereof will be omitted.

Figure 19:
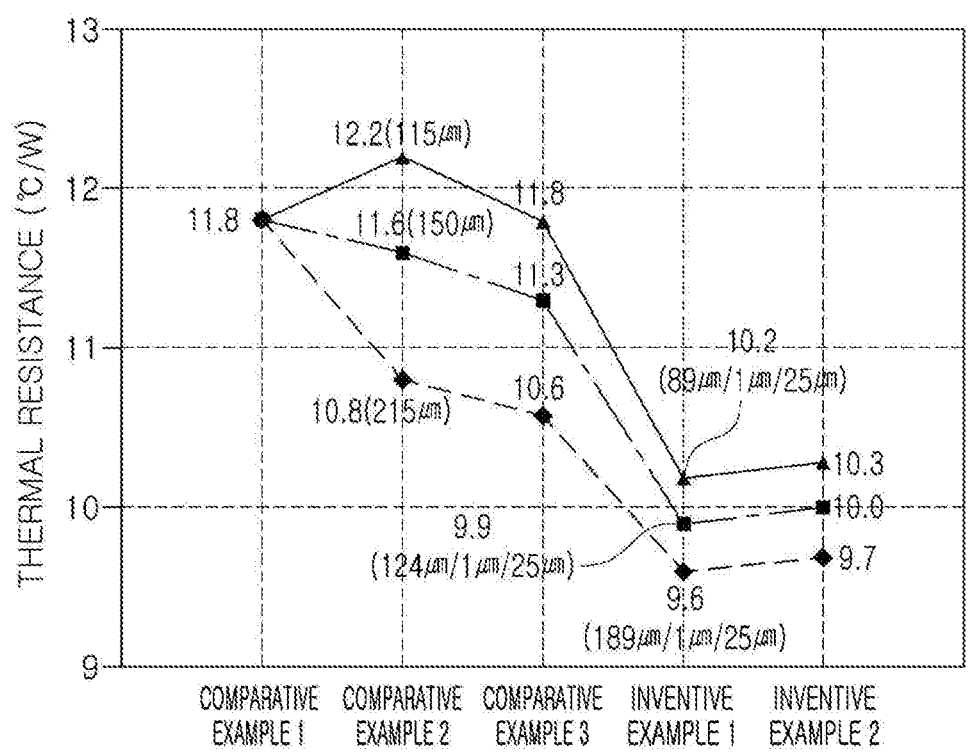
FIG. 19 is a graph illustrating simulation results for a heat dissipation effect of a semiconductor package according to an example embodiment in the present disclosure.

FIG. 19 is a graph illustrating simulation results for a heat dissipation effect of a semiconductor package according to an example embodiment in the present disclosure.

FIG. 19 illustrates results obtained by simulating thermal resistances in Comparative Examples 1 to 3, Inventive Example 1, and Inventive Example 2 having different package structure. In this case, Comparative Example 1 is a case in which a lower package includes a semiconductor chip having a having a thickness of 100 µm in a laser drilling process (LDP)-Pop structure. Comparative Example 2 is a case in which a heat dissipation member 170 and an adhesive member 175 are omitted in the semiconductor package 100A according to an example embodiment, and the semiconductor package 100A includes semiconductor chips 120 having thicknesses of 115 µm, 150 µm, and 215 µm. Comparative Example 3 is a case in which a graphite layer, having a thickness of 3 µm, is formed on an inactive surface of the semiconductor chip 120 by sputtering, in Comparative Example 2. Inventive Example 1 is a case in which a semiconductor chip 120/an adhesive member 175/a heat dissipation member 170, respectively having thicknesses of 89 µm/1 µm/25 µm, 124 µm/1 µm/25 µm, and 189 µm/1 µm/25 µm, were used in the semiconductor package 100A according to an example embodiment. However, an additional hole 170H was not processed in the heat dissipation member 170. An epoxy-acrylic type low-viscosity adhesive having a significantly low thickness was used as the adhesive member 175, and a pyrolytic graphite sheet (PGS) was used as the heat dissipation member 170. Inventive Example 2 is a case in which a plurality of holes 170H are processed in the heat dissipation member 170 in Inventive Example 1. In this case, a diameter of each of the plurality of holes 170H was 300 µm, the total number of the holes 170 was 5×5=25, and a pitch between holes 170H was 1.7 mm. As a result, a sum of planar areas $S_2$ of the respective holes 170H to a planar area $S_1$ of the heat dissipation member 170 on a plane was about 7.1%.

As can be seen from the simulation results, a thermal resistance reduction effect of Examples 1 and 2 is significantly better than that of Comparative Examples 2 and 3 on the basis of Comparative Example 1. When comparing Comparative Example 3 with Inventive Examples 1 and 2, Comparative Example 3 exhibited relatively high thermal resistance because there is a limitation in increasing a thickness of a graphite layer, simply formed by sputtering, in terms of process and cost. Meanwhile, in the case of Inventive Examples 1 and 2, a heat dissipation member 170 was formed to have a relatively greater thickness than that in Comparative example 3 and, thus, a heat dissipation result was improved. In the case of Inventive Example 2, the heat dissipation effect was reduced as compared with Inventive Example 1 by processing a plurality of holes 170H in the heat dissipation member 170, but it will be understood thermal resistance was increased by about 1%, which was not a significant difference.

Figure 20:
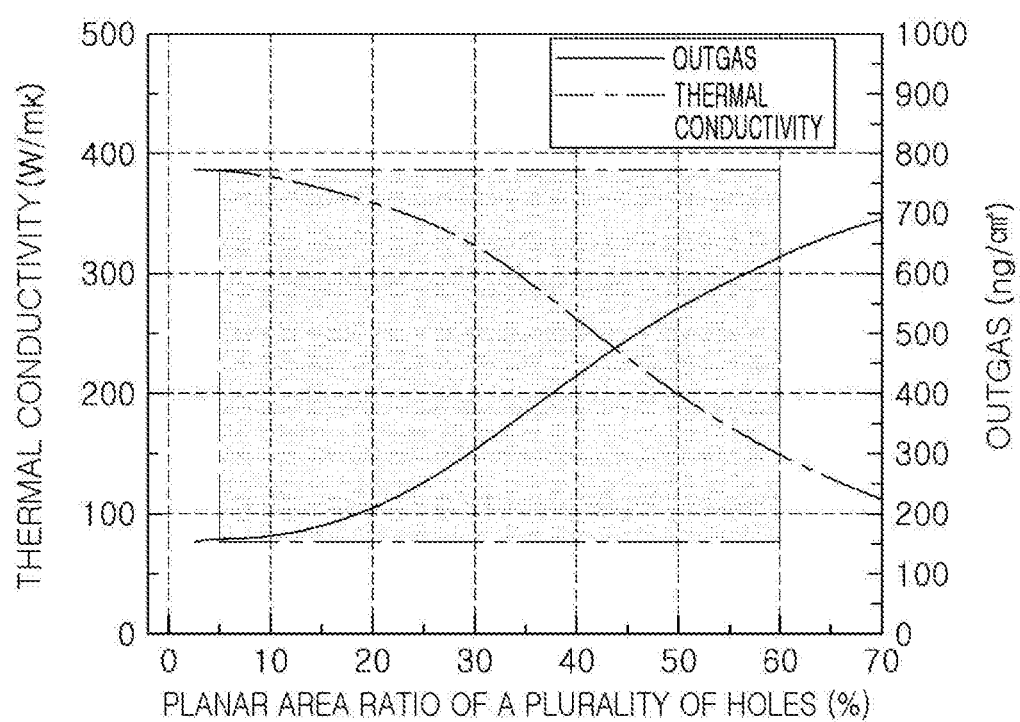
FIG. 20 is a graph illustrating simulation results for a heat dissipation result of a heat dissipation member and an outgassing effect of an adhesive member depending on a planar area, occupied by a plurality of holes, in a semiconductor package according to an example embodiment in the present disclosure.

FIG. 20 is a graph illustrating simulation results for a heat dissipation result of a heat dissipation member and an outgassing effect of an adhesive member depending on a planar area, occupied by a plurality of holes, in a semiconductor package according to an example embodiment in the present disclosure.

FIG. 20 illustrates results obtained by simulating thermal conductivity of a heat dissipation member 170 and the amount of outgassing of an adhesive member 175 depending on a ratio of a planar area, occupied by a plurality of holes 170H, to a planar area of the heat dissipation member 170. In an experiment, a package structure, including a semiconductor chip 120/an adhesive member 175/a heat dissipation member 170 respectively having thicknesses of 125 µm/1 µm/25 µm, was used in a semiconductor package 100A according to an example embodiment. An epoxy-acrylic type low-viscosity adhesive having a significantly low thickness was used as the adhesive member 175, and a pyrolytic graphite sheet (PGS) was used as the heat dissipation member 170. A planar area of the heat dissipation member 170 is 100 mm$^2$ (10 mm width×10 mm length), and each of the plurality of holes 170H had a diameter of 300 µm. A sum of planar areas $S_2$ of the respective holes 170H to a planar area S1 of the heat dissipation member 170 on a plane was varied by changing the total number of the plurality of holes 170H and a pitch therebetween.

As can be seen from the simulation results, when a ratio of the planar areas of the plurality of holes 170H is less than 60%, thermal conductivity of the heat dissipation member 170 may be greater than 150 W/mK and a heat dissipation effect may be meaningful. When the ratio of the planar areas of the plurality of holes 170H is 60% or less, the thermal conductivity of the heat dissipation member 170 is 150 W/mK or less, which is less than thermal conductivity of silicon (Si), and a heat dissipation effect cannot be meaningful. When the ratio of the planar areas of the plurality of holes 170H is greater than 5%, the amount of outgassing of the adhesive member 175 may be greater than 150 ng/cm$^2$ to achieve a meaningful outgassing effect through the plurality of holes 170H. There may be a relatively higher possibility that outgassing of the adhesive member 175 is emitted through a region between the semiconductor chip 120 and the heat dissipation member 170 or an inside of the heat dissipation member 170 when the ratio of the planar areas of the plurality of holes 170H is 5% or less than that when the ratio of the planar areas of the plurality of holes 170H is greater than 5%. For example, when the when the ratio of the planar areas of the plurality of holes 170H is greater than 5%, reliability issues, such as void, caused by delamination, internal cracking, and the like, may be effectively addressed.

As described above, a semiconductor package, to which a heat dissipation member may be introduced to improve heat dissipation characteristics, may be provided. In addition, a semiconductor package, which may address reliability issues such as cohesion of a heat dissipation member, interface delamination between components between a semiconductor chip and a heat dissipating member, internal cracking of the heat dissipating member, and the like, may be provided.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A semiconductor package comprising:
a semiconductor chip having an active surface, on which a connection pad is disposed, and an inactive surface disposed to oppose the active surface;
a heat dissipation member disposed on the inactive surface of the semiconductor chip having a plurality of holes, and including a graphite-based material;
an encapsulant covering at least a portion of each of the semiconductor chip and the heat dissipation member;
a connection member disposed on the active surface of the semiconductor chip and including a redistribution layer connected to the connection pad; and
a first metal layer disposed in a space between wall surfaces of each of the plurality of holes and being in contact with at least a portion of a wall surface of each of the plurality of holes,
wherein $0<b<0.6a$, in which "a" denotes a planar area of the heat dissipation member and "b" denotes a sum of planar areas of the plurality of holes on a plane, and
the encapsulation covers at least a portion of a top surface of the heat dissipation member, at least a portion of a side surface of the heat dissipation member, and at least a portion of a top surface of the first metal layer.

2. The semiconductor package of claim 1, wherein the heat dissipation member includes a pyrolytic graphite sheet (PGS).

3. The semiconductor package of claim 2, wherein the heat dissipation member further includes at least one of zirconium (Zr), chromium (Cr), and boron (B) as a first additive.

4. The semiconductor package of claim 2, wherein the heat dissipation member includes at least one of carbon nanotubes (CNT), a boron nitride, and a combination thereof as a second additive.

5. The semiconductor package of claim 1, wherein $0.05a<b<0.6a$.

6. The semiconductor package of claim 1, further comprising:
an adhesive member disposed between the inactive surface of the semiconductor chip and the heat dissipation member.

7. The semiconductor package of claim 6, wherein the adhesive member fills a portion of a lower side of at least one of the plurality of holes.

8. The semiconductor package of claim 6, wherein the adhesive member has a thickness less than 3 μm and thermal conductivity of 0.5 W/mK or less.

9. The semiconductor package of claim 6, wherein the adhesive member has a thickness of 3 μm or more and thermal conductivity higher than 0.5 W/mK.

10. The semiconductor package of claim 1, wherein a side surface of the semiconductor chip and the side surface of the heat dissipation member are substantially coplanar with each other.

11. The semiconductor package of claim 1, further comprising:
a frame including a plurality of wiring layers connected to the connection pad and having a through-hole,
wherein the semiconductor chip and the heat dissipation member are disposed in the through-hole, and
the encapsulant is disposed in at least a portion of the through-hole.

12. A semiconductor package comprising:
a semiconductor chip having an active surface, on which a connection pad is disposed, and an inactive surface disposed to oppose the active surface;
a heat dissipation member disposed on the inactive surface of the semiconductor chip having a plurality of holes, and including a graphite-based material;
an encapsulant covering at least a portion of each of the semiconductor chip and the heat dissipation member;
a connection member disposed on the active surface of the semiconductor chip and including a redistribution layer connected to the connection pad; and
a second metal layer covering a top surface of the heat dissipation member, a bottom surface of the heat dissipation member, a side surface of the heat dissipation member, and a wall surface of each of the plurality of holes,
wherein the encapsulant is disposed in a space between the second metal layer in each of the plurality of holes, and
$0<b<0.6a$, in which "a" denotes a planar area of the heat dissipation member and "b" denotes a sum of planar areas of the plurality of holes on a plane.

13. The semiconductor package of claim 12, wherein the second metal layer includes a 2-1-th metal layer, disposed on the top surface of the heat dissipation member, the bottom surface of the heat dissipation member, the side surface of the heat dissipation member, and the wall surface of each of the plurality of holes, and a 2-2-th metal layer, disposed on the 2-1-th metal layer, having a thickness greater than a thickness of the 2-1-th metal layer.

14. A semiconductor package comprising:
a semiconductor chip having an active surface, on which a connection pad is disposed, and an inactive surface disposed to oppose the active surface;
a heat dissipation member disposed on the inactive surface of the semiconductor chip, having a plurality of holes, and including a graphite-based material;
an encapsulant covering at least a portion of each of the semiconductor chip and the heat dissipation member;
a connection member disposed on the active surface of the semiconductor chip, and including a redistribution layer connected to the connection pad, and
an adhesive member disposed between the inactive surface of the semiconductor chip and the heat dissipation member, and disposed in a portion of at least one of the plurality of holes,
wherein the plurality of holes are filled with the encapsulant or a metal, and
surfaces of the heat dissipation member are coated with a metal layer separating the graphite-based material from the encapsulant and the adhesive member.

* * * * *